United States Patent
Marutani

(10) Patent No.: US 11,515,458 B2
(45) Date of Patent: Nov. 29, 2022

(54) LIGHT EMITTING DEVICE, RESIN-ATTACHED LEAD FRAME, AND METHODS OF MANUFACTURING THE SAME

(71) Applicant: NICHIA CORPORATION, Anan (JP)

(72) Inventor: Yukitoshi Marutani, Anan (JP)

(73) Assignee: NICHIA CORPORATION, Anan (JP)

( * ) Notice: Subject to any disclaimer, the term of this patent is extended or adjusted under 35 U.S.C. 154(b) by 170 days.

(21) Appl. No.: 17/136,535

(22) Filed: Dec. 29, 2020

(65) Prior Publication Data

US 2021/0119097 A1    Apr. 22, 2021

Related U.S. Application Data

(63) Continuation of application No. 16/392,106, filed on Apr. 23, 2019, now Pat. No. 10,910,537.

(30) Foreign Application Priority Data

Apr. 23, 2018  (JP) .............................. JP2018-082516

(51) Int. Cl.
*H01L 33/62* (2010.01)
*H01L 23/495* (2006.01)
(Continued)

(52) U.S. Cl.
CPC .......... *H01L 33/62* (2013.01); *H01L 21/4821* (2013.01); *H01L 23/49541* (2013.01);
(Continued)

(58) Field of Classification Search
None
See application file for complete search history.

(56) References Cited

U.S. PATENT DOCUMENTS

| 10,510,935 B2 | 12/2019 | Richter | |
| 2014/0014993 A1* | 1/2014 | Koseki | H01L 33/56 |
| | | | 257/98 |

(Continued)

FOREIGN PATENT DOCUMENTS

| JP | 2012-89547 A | 5/2012 |
| JP | 2013-125867 A | 6/2013 |

(Continued)

OTHER PUBLICATIONS

U.S. Office Action for U.S. Appl. No. 16/392,106, dated May 14, 2020.

*Primary Examiner* — Benjamin P Sandvik
(74) *Attorney, Agent, or Firm* — Birch, Stewart, Kolasch & Birch, LLP

(57) ABSTRACT

A light emitting device includes: a base body including two conductive members, a resin body, and a fiber member placed inside the resin body, and a light-emitting element. The resin body includes an isolation section located between the two conductive members, and includes a pair of sandwiching portions sandwiching the isolation section. The fiber member has a length which is greater than a distance between the two conductive members, and is located at least in an adjoining region of at least one of the pair of sandwiching portions, the adjoining region adjoining the isolation section. In the adjoining region, the fiber member extends in a direction which is non-orthogonal to a direction in which that the pair of sandwiching portions extend.

36 Claims, 41 Drawing Sheets

(51) Int. Cl.
  *H01L 21/48*    (2006.01)
  *H01L 33/48*    (2010.01)
  *H01L 33/52*    (2010.01)

(52) U.S. Cl.
  CPC ...... *H01L 23/49586* (2013.01); *H01L 33/483* (2013.01); *H01L 33/52* (2013.01); *H01L 2933/0066* (2013.01)

(56) References Cited

U.S. PATENT DOCUMENTS

| | | |
|---|---|---|
| 2016/0043291 A1 | 2/2016 | Gebuhr et al. |
| 2017/0351069 A1 | 12/2017 | Yamada et al. |
| 2020/0096163 A1 | 3/2020 | Yamaoka |

FOREIGN PATENT DOCUMENTS

| | | |
|---|---|---|
| JP | 2015-37100 A | 2/2015 |
| JP | 2016-516309 A | 6/2016 |

\* cited by examiner

FIG.15A
FIG.15B
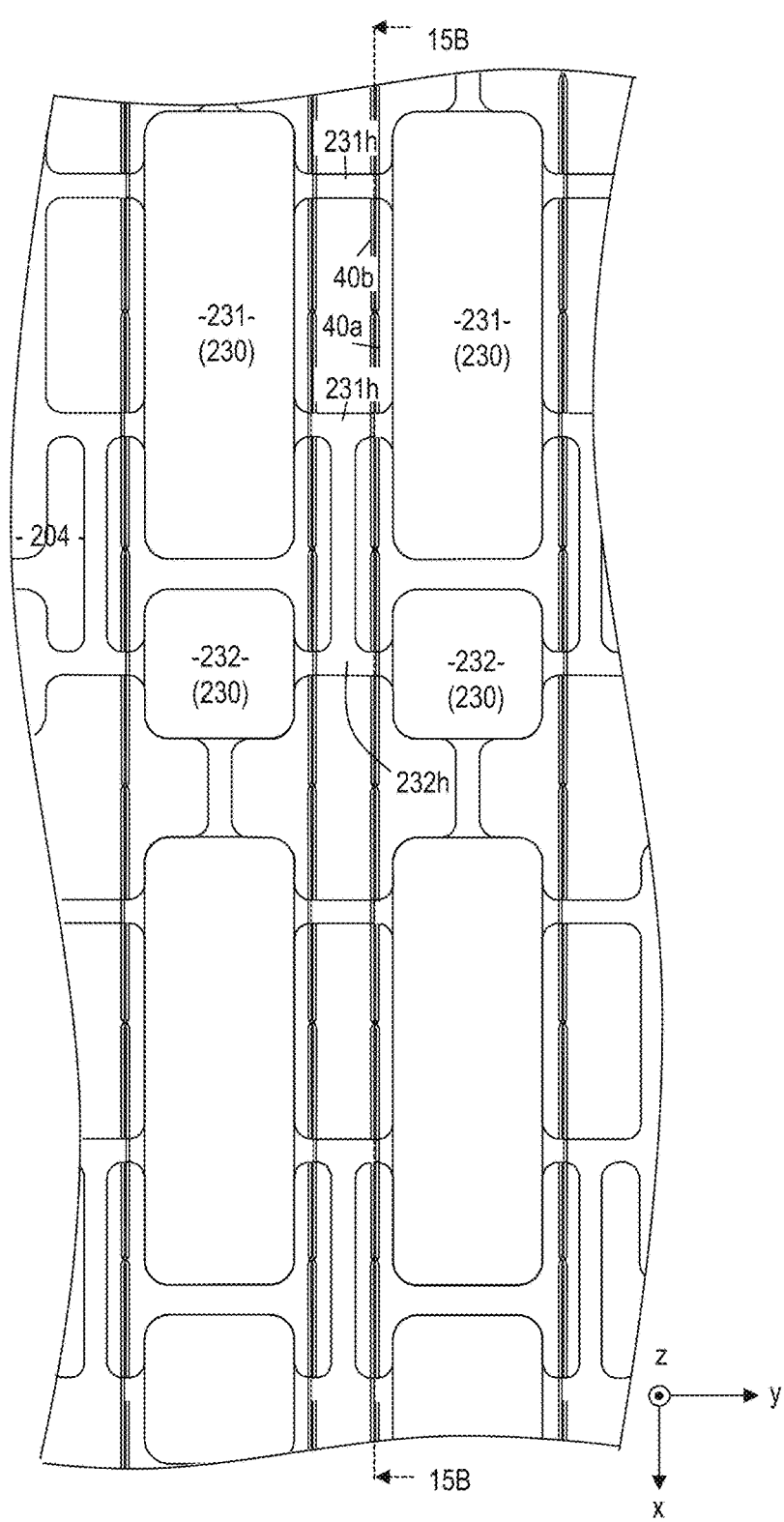
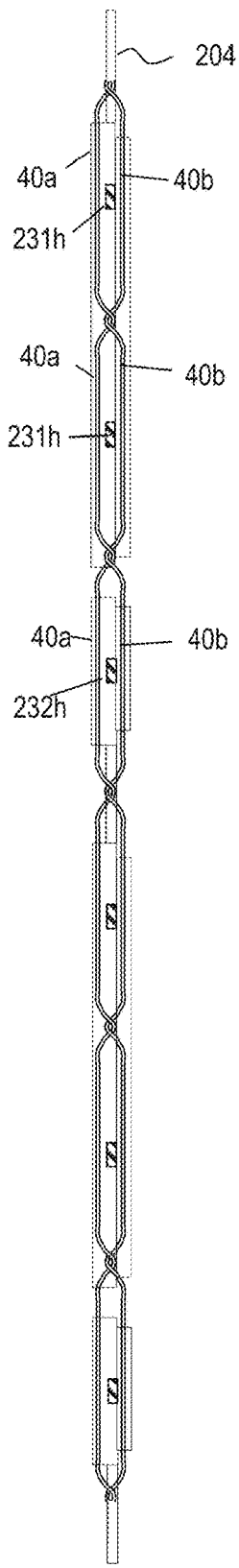

LIGHT EMITTING DEVICE, RESIN-ATTACHED LEAD FRAME, AND METHODS OF MANUFACTURING THE SAME

CROSS-REFERENCE TO RELATED APPLICATION

This application is a Continuation of copending U.S. patent application Ser. No. 16/392,106, filed Apr. 23, 2019, which claims priority to Japanese Patent Application No. 2018-082516, filed on Apr. 23, 2018, the disclosure of which is hereby incorporated by reference in its entirety.

BACKGROUND

The present application relates to a light emitting device, a resin-attached lead frame, and methods of manufacturing the same.

Light emitting devices incorporating semiconductor light-emitting elements, e.g., light-emitting diodes (LED), are characterized by being smaller in size, having better power efficiency, and being longer-lived than conventional filament-based light sources, and also characterized by having good initial driving characteristics and withstanding repetitive turning ON and OFF. Therefore, such light emitting devices are used as light sources for various applications, such as display devices and lighting fixtures.

Such a light emitting device may include, for example, a base body (also called a package) which is composed of leads and a resin molding, and a light-emitting element that is mounted on the base body. As is disclosed in e.g. Japanese Patent Publication No. 2012-89547, this type of light emitting device is formed by an insert molding using a lead frame and a white resin which is non light-transmitting but light-reflective, where a plurality of resin moldings are formed on the lead frame at a predetermined interval, each resin molding having a recess in which a light-emitting element is to be mounted, and after the light-emitting elements are mounted in the recesses, lead frame and the resin moldings are cut and singulated.

In a light emitting device having a base body as aforementioned, in some cases, the base body is expected to have improved strength.

SUMMARY OF INVENTION

The present disclosure provides a light emitting device and a resin-attached lead frame, these having a base body with improved strength, and methods of producing the same.

A light emitting device according to the present disclosure comprises: a base body including two conductive members each having an upper face and a lower face, a resin body covering a part of each conductive member, and a fiber member placed inside the resin body, a part of the upper face of each conductive member being exposed from the resin body at an upper side of the base body, and a part of the lower face of each conductive member being exposed from the resin body at a lower side of the base body; and a light-emitting element electrically connected to the two conductive members, wherein, the resin body includes an isolation section located between the two conductive members, and includes a pair of sandwiching portions sandwiching the isolation section; the fiber member has a length which is greater than a distance between the two conductive members, and is located at least in an adjoining region of at least one of the pair of sandwiching portions, the adjoining region adjoining the isolation section; and, in the adjoining region, the fiber member extends in a direction which is non-orthogonal to a direction that the pair of sandwiching portions extend.

According to the present disclosure, a light emitting device including a base body with improved base body strength can be realized.

BRIEF DESCRIPTION OF THE DRAWINGS

FIG. 15A is an upper plan view showing enlarged a plurality of fiber members being placed on a lead frame which is used for manufacturing a fourth light emitting device.

FIG. 15B is a cross-sectional view showing enlarged the plurality of fiber members being placed on a lead frame which is used for manufacturing a fourth light emitting device.

DETAILED DESCRIPTION

When a semiconductor device having a base body is mounted on e.g. a printed circuit board, a light emitting device which is supplied from a feeder unit of a chip mounter (surface mounter) is picked up by a nozzle (collet) of the chip mounter, and the semiconductor device having been picked up is mounted on an intended place on the printed circuit board. At this time, the package of the semiconductor device is stressed by the nozzle.

The resin molding composing the base body may contain a filler in order to achieve a high light-shielding ability or light reflectivity. However, as the content ratio of the filler increases, the strength of the resin molding may lower. Therefore, when the semiconductor device possesses a package utilizing a resin molding that profusely contains filler, the package of the light emitting device may be stressed by the pickup nozzle of a chip mounter during mounting, such that fissures, cracks, etc., may occur in the resin molding. In the presence of such fissures or breaking, wire breaks or the like may occur, thus causing malfunctioning of the light emitting device, or lowering hermeticity of the light emitting device and degrading reliability.

In view of such problems, a light emitting device according to the present disclosure possesses a package having a base body with a resin molding whose strength is enhanced with a fiber member(s). Hereinafter, embodiments of light emitting devices according to the present disclosure will be described in detail.

First Embodiment

[Structure of the Light Emitting Device]

Figure 1:
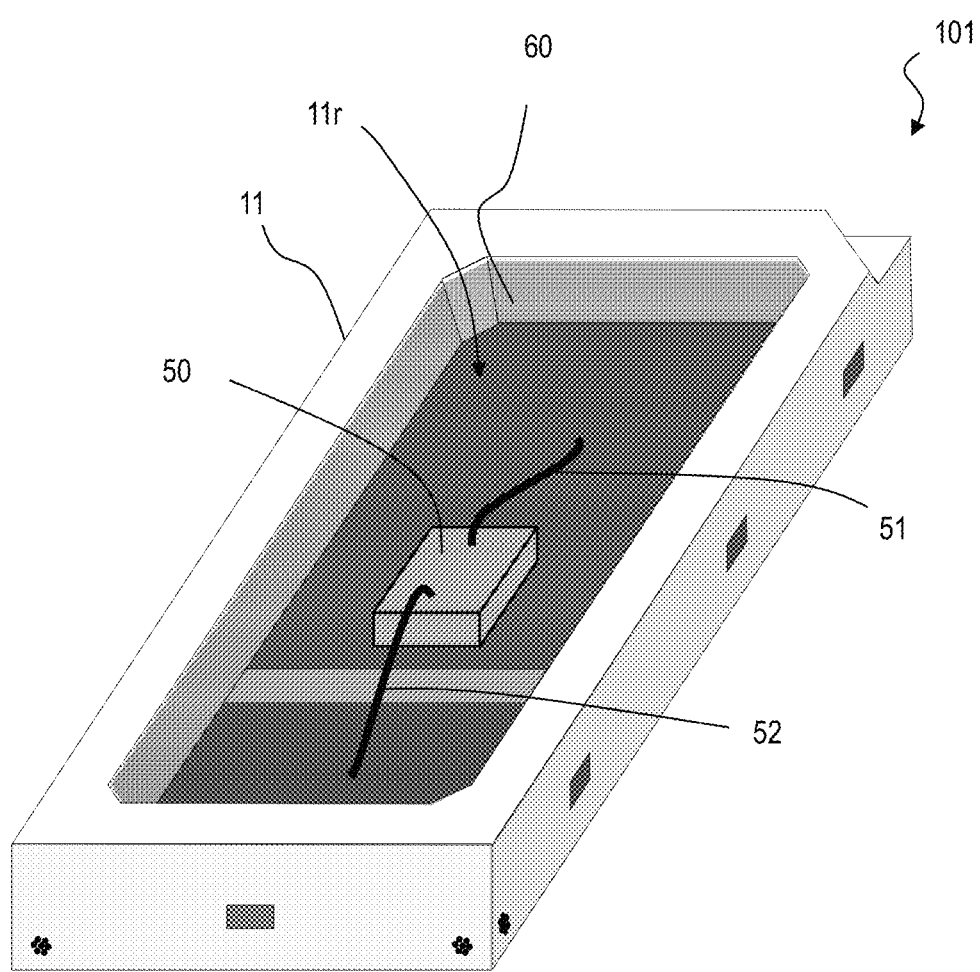
FIG. 1 is a perspective view of a light emitting device according to a first embodiment.

FIG. 1 is a perspective view of a light emitting device 101 according to the present disclosure. The light emitting device 101 includes a base body 11, a light-emitting element 50, and a sealing member 60. The respective component elements will be described in detail below. The base body 11 has a recess 11r, such that the light-emitting element 50 is placed at the bottom of the recess 11r. The sealing member 60 covers the light-emitting element 50, and is placed inside the recess 11r.

[Base Body]

Figure 2A:
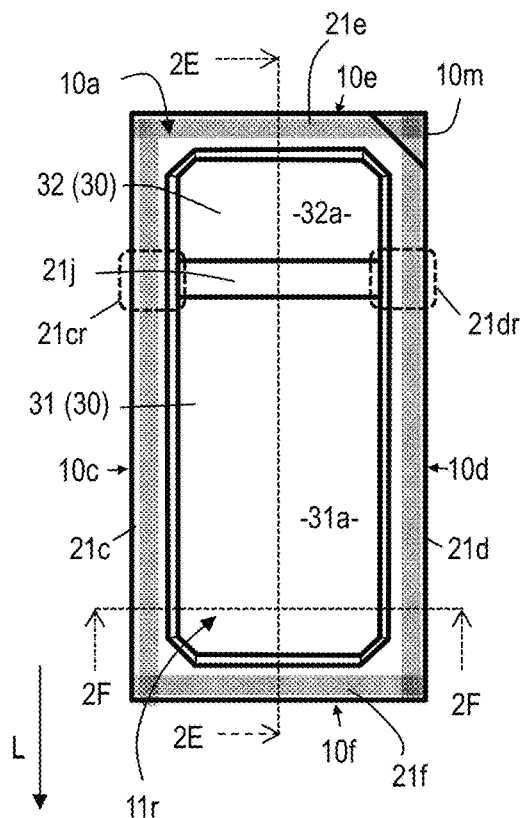
FIG. 2A is a plan view of a base body of the light emitting device in FIG. 1.
Figure 2B:
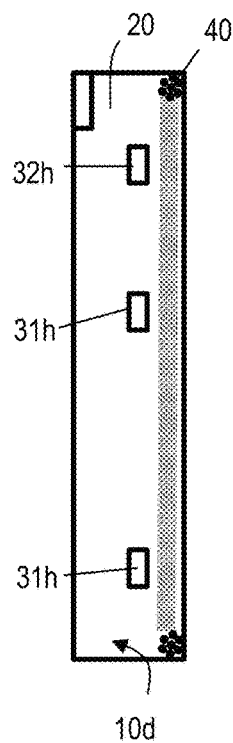
FIG. 2B is a side view of the base body of the light emitting device in FIG. 1.
Figure 2C:
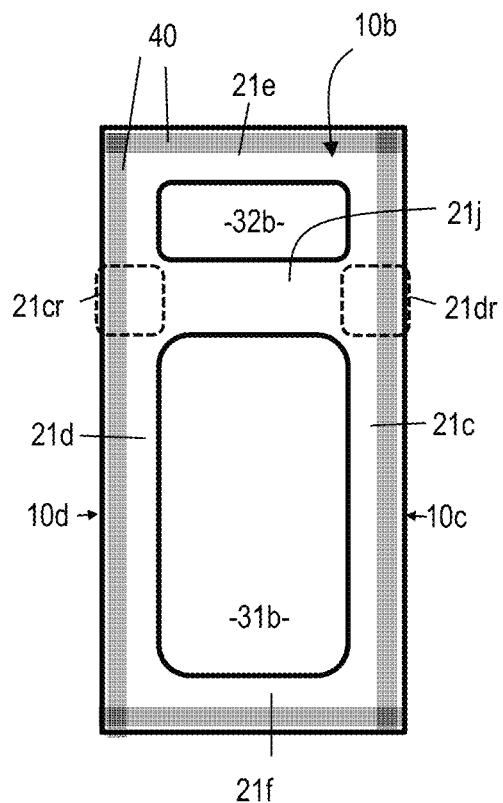
FIG. 2C is a bottom view of the base body of the light emitting device in FIG. 1.
Figure 2D:
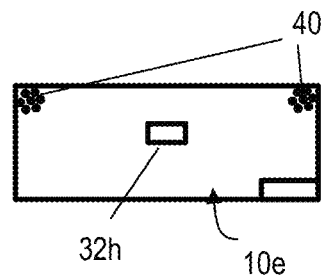
FIG. 2D is a plan view of the base body of the light emitting device in FIG. 1.
Figure 2E:
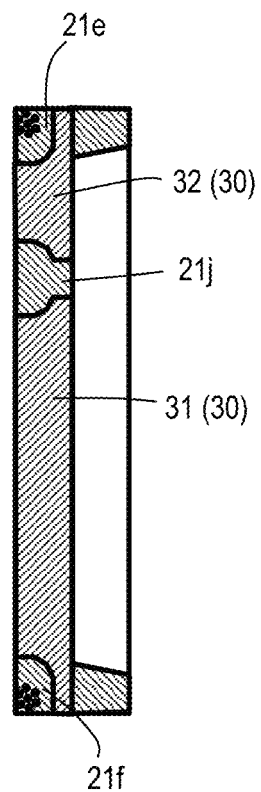
FIG. 2E is a cross-sectional view of the base body taken at line 2E-2E in FIG. 2A.
Figure 2F:
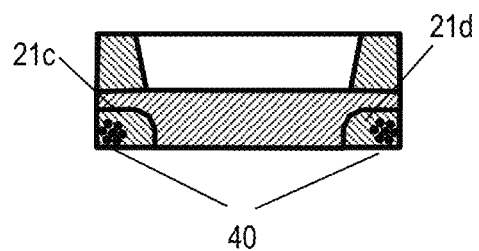
FIG. 2F is a cross-sectional view of the base body taken at line 2E-2E in FIG. 2A.

The base body 11 functions as a housing for retaining the light-emitting element 50. The base body 11 is also called a package. It also provides terminals for electrically connecting the light-emitting element 50 with the outside of the light emitting device 101. FIGS. 2A, 2B, 2C, and 2D are respectively a plan view, a side view, a bottom view, and a rear view of the base body 11; and FIGS. 2E and 2F are cross-sectional views of the base body 11 taken at line 2E-2E and line 2F-2F in FIG. 2A, respectively.

The base body 11 includes a resin body 20, conductive members 30, and fiber members 40. As will be described later, the base body 11 is integrally formed of the resin body 20, the conductive members 30, and the fiber members 40.

The base body 11 has an upper face 10a and a lower face 10b which is located at the opposite side to the upper face 10a. In the present embodiment, in top view, the base body 11 has a substantially rectangular outer shape. Therefore, the base body 11 has four outer lateral faces: an outer lateral face 10c, an outer lateral face 10d which is located at the opposite side to the outer lateral face 10c, an outer lateral face 10e, and an outer lateral face 10f which is located at the opposite side to the outer lateral face 10e. The outer shape of the base body 11 in top view is not limited to a rectangle, but may be any other shape. Moreover, the base body 11 may have an anode mark (or a cathode mark) 10m that is formed by removing a portion off one of the corners of the upper face 10a. The anode mark 10m functions as a mark indicating the polarities of the two conductive members 30.

The recess 11r opens in the upper face 10a of the base body 11. At the bottom face of the recess 11r, a part of an upper face 31a of the first conductive member 31 (mentioned below) and a part of an upper face 32a of the second conductive member 32 (mentioned below) are located and exposed. At the lower face 10b of the base body 11, a part of a lower face 31b of the first conductive member 31 and a part of a lower face 32b of the second conductive member 32 are exposed.

[Conductive Member]

In the present embodiment, the conductive members 30 include a first conductive member 31 and a second conductive member 32. The first conductive member 31 has an upper face 31a and a lower face 31b which is located at the opposite side to the upper face 31a. The second conductive member 32 has an upper face 32a and a lower face 32b which is located at the opposite side to the upper face 32a. The first conductive member 31 and the second conductive member 32 are placed side by side, such that the lower face 31b and the lower face 32b are substantially coplanar with each other. Between the first conductive member 31 and the second conductive member 32, an isolation section 21j of the resin body 20 as will be described below is located.

Figure 3A:
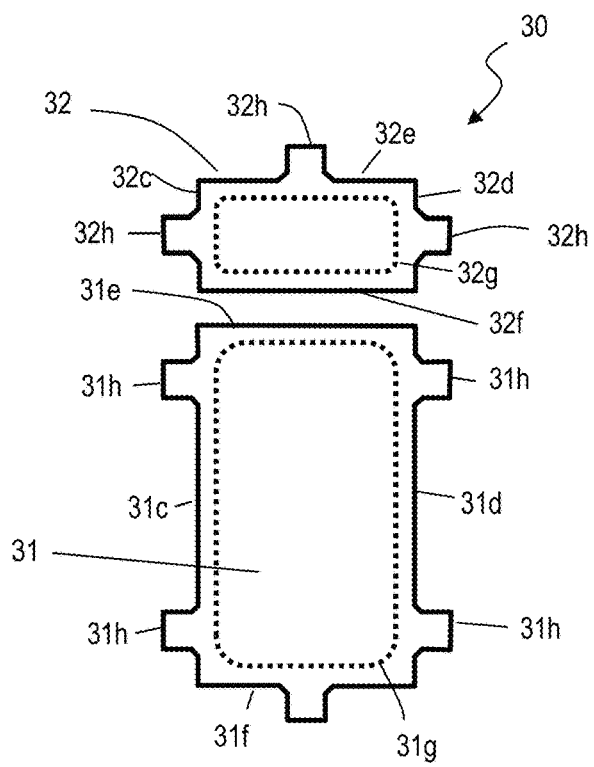
FIG. 3A is a plan view of conductive members of the light emitting device in FIG. 1.
Figure 3B:
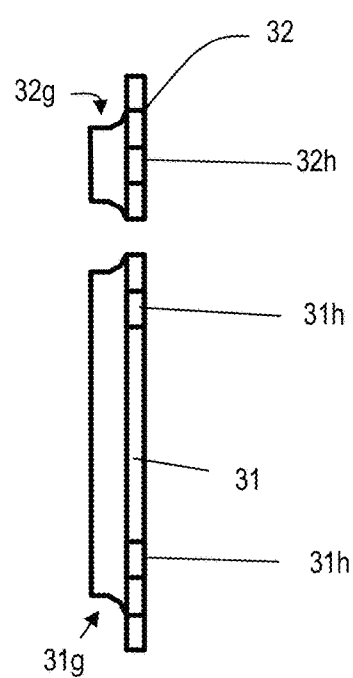
FIG. 3B is a side view of conductive members of the light emitting device in FIG. 1.
Figure 3C:
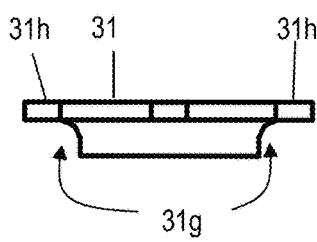
FIG. 3C is a front view of conductive members of the light emitting device in FIG. 1.

FIGS. 3A, 3B, and 3C are a plan view, a side view, and a front view, respectively, of the conductive members 30. The first conductive member 31 and the second conductive member 32 are electrically conductive, and function as electrodes for supplying power to the light-emitting element 50. Although the present embodiment illustrates the conductive members 30 as including the first conductive member 31 and the second conductive member 32, the conductive members 30 may include a third conductive member in addition to the first conductive member 31 and the second conductive member 32. The third conductive member may function as an electrode, or function as a heat dissipation member with high thermal conductivity.

In the present embodiment, the first conductive member 31 and the second conductive member 32 each have a substantially rectangular shape.

The first conductive member 31 includes lateral portions 31c, 31d, 31f, and 31e. At the lower face 31b side, the first conductive member 31 has a lateral peripheral groove 31g in the lateral portions 31c, 31d, 31f, and 31e.

Similarly, the second conductive member 32 includes lateral portions 32c, 32d, 32f, and 32e. At the lower face 32b side, the second conductive member 32 has a lateral peripheral groove 32g in the lateral portions 32c, 32d, 32f, and 32e. The lateral peripheral grooves 31g and 32g can formed by an etching process, a pressing process, or the like.

From each of the lateral portions 31c, 31d, and 31f of the first conductive member 31, an extending portion(s) 31h is provided. In the present embodiment, two extending portions 31h are provided on each of the lateral portions 31c and 31d. Similarly, one extending portion 32h is provided from each of the lateral portions 32c, 32d, and 32e of the second conductive member 32. Each extending portion extends toward the outer lateral face 10c, 10d, 10e, or 10f.

The lateral portion 31e of the first conductive member 31 and the lateral portion 32f of the second conductive member 32, each of which has no extending portion, are opposed to each other via a gap. In this gap, a part of the resin body 20 is located, as will be described later. Moreover, the extending portion 31h and the lateral peripheral groove 31g of the first conductive member 31 and the extending portion 32h and the lateral peripheral groove 32g of the second conductive member 32 are embedded inside the resin body 20.

The lateral peripheral grooves 31g and 32g which are made in the first conductive member 31 and the second conductive member 32 are provided in order to promote adhesion between the resin body 20 and the first conductive member 31 or second conductive member 32. In the below-described lead frame, the extending portions 31h and 32h are a part of a connecting portion that allows sites to become the first conductive member 31 and the second conductive member 32 to be interconnected to an outer frame portion.

In the present embodiment, in top view, the first conductive member 31 has a greater area than does the second conductive member 32. This is because the light-emitting element 50 is to be disposed on the first conductive member 31. However, in the case where the light-emitting element 50 is placed on the second conductive member 32, the area of the second conductive member 32 may be greater than the area of the first conductive member 31 in top view. Further the light-emitting element 50 may be provided across both of the first conductive member 31 and the second conductive member 32. In this case, in top view, the first conductive member 31 and the second conductive member 32 may have substantially the same area.

Each of the first conductive member 31 and the second conductive member 32 includes a substrate and a metal layer covering the substrate. The substrate is preferably a plate-like member. The substrate may contain a metal such as copper, aluminum, gold, silver, iron, nickel, or an alloy thereof; phosphor bronze; iron-containing copper; or the like. These may be of a single layer, or have a multilayer structure (e.g., a clad material). Copper, which is inexpensive and has high heat-releasing ability, is particularly preferably used for the substrate. The metal layer may contain e.g. silver, aluminum, nickel, palladium, rhodium, gold, copper, or an alloy thereof, etc. Further each of the first conductive member 31 and the second conductive member 32 may have a region where no metal layer is provided. Regarding the first conductive member 31 and the second conductive member 32, the metal layer that is formed on the upper faces 31a and 32a may be different from the metal layer that is formed on the lower faces 31b and 32b. For example, the metal layer formed on the upper faces 31a and 32a may be a metal layer consisting of multiple layers including a metal layer of nickel, while the metal layer formed on the lower faces 31b and 32b may be a metal layer that does not include a metal layer of nickel.

Moreover, in the case where a plating layer of silver or a silver alloy is formed on the outermost surface of the first conductive member 31 and the second conductive member 32, preferably a protective layer of silicon oxide or the like is provided on the surface of the plating layer of silver or a silver alloy. This can suppress the plating layer of silver or a silver alloy from discoloring because of a sulfur component, etc., in the atmospheric air. As the film formation method for the protective layer, a vacuum process such as sputtering may be used, but any other known method may also be used. The protective layer may be formed after the light-emitting element 50 is mounted and furnished with wire connections and before the sealing member 60 is formed, or, formed in a part or a whole of the surface of the sealing member 60 after the sealing member 60 is formed.

[Resin Body]

The resin body 20 includes a pair of sandwiching portions 21c and 21d, a pair of interconnecting portions 21e and 21f, and an isolation section 21j. The isolation section 21j is disposed between the first conductive member 31 and the second conductive member 32, and retains a gap between the first conductive member 31 and the second conductive member 32 while keeping the first conductive member 31 and the second conductive member 32 spaced apart, whereby the first conductive member 31 and the second conductive member 32 are separated. The sandwiching portions 21c and 21d are placed so that the isolation section 21j and the conductive members 30 (i.e., the first conductive member 31 and the second conductive member 32) are sandwiched therebetween. The interconnecting portions 21e and 21f are connected to both ends of the sandwiching portions 21c and 21d, thereby interconnecting the sandwiching portions 21c and 21d. Moreover, the interconnecting portions 21e and 21f are placed so that the first conductive member 31 and the second conductive member 32 are interposed therebetween. The sandwiching portions 21c and 21d and the interconnecting portions 21e and 21f constitute a frame shape surrounding the recess 11r; as a result of this, at the bottom face of the recess 11r (that is, at an upper side of the resin body 20), a part of the upper face 31a of the first conductive member 31 and a part of the upper face 32a of the second conductive member 32, and the isolation section 21j are exposed. At a lower side of the resin body 20, a part of the lower face 31b of the first conductive member 31 and a part of the lower face 32b of the second conductive member 32, and the isolation section 21j are exposed.

The sandwiching portions 21c and 21d have adjoining regions 21cr and 21dr, respectively, that adjoin the isolation section 21j. The sandwiching portion 21c and the sandwiching portion 21d have the outer lateral face 10c and the outer lateral face 10d, respectively. The interconnecting portion 21e and the interconnecting portion 21f have the outer lateral face 10e and the outer lateral face 10f, respectively.

The resin body 20 is made of a thermosetting resin, for example. A preferable thermosetting resin is at least one selected from the group consisting of an epoxy resin, a modified epoxy resin, a silicone resin, a modified silicone resin, an acrylate resin, and an urethane resin. In particular, epoxy resins, modified epoxy resins, silicone resins, modified silicone resins, and the like can be used. Alternatively, the resin body 20 may be made of a thermoplastic resin.

In addition to the resin, the resin body 20 may also contain a filler, an acid anhydride, an antioxidant, a release agent, a curing catalyst, a light stabilizer, a lubricant, and the like. For example, as a filler, particles, short fibers, etc., of a light-reflective substance or a light-shielding substance may be dispersed in a thermosetting resin. Other than adjusting the optical properties as mentioned above, the filler may also be used for adjusting thermal properties such as thermal conductivity of the resin.

Examples of particles of a light-reflective substance that may be used as the filler include particles of titanium oxide, silicon oxide, zirconium oxide, magnesium oxide, calcium carbonate, calcium hydroxide, calcium silicate, zinc oxide, barium titanate, potassium titanate, alumina, aluminum nitride, boron nitride, mullite, and the like. By using particles of any such material, light can be efficiently reflected. Examples of particles of a light-shielding substance to be used as the filler include coloring pigment particles containing carbon black or a transition metal compound. As the filler, each of these may be used alone, or two or more of them may be used in combination. This allows the light reflectance and light-shielding ability of the resin containing the filler to be adjusted, and also the coefficient of linear expansion of the resin to be adjusted.

[Fiber Member]

The fiber members 40 are located inside the adjoining region(s) 21cr and/or 21dr of at least one of the sandwiching portions 21c and 21d. Inside the adjoining region 21cr or the adjoining region 21dr, the fiber members 40 extend in a direction which is non-orthogonal to the direction L that the sandwiching portion 21c or the sandwiching portion 21d extends. A direction which is orthogonal to the direction L that the sandwiching portion 21c or 21d extends may be any direction on a plane P that is perpendicular to the direction L; therefore, to "extend in a direction which is non-orthogonal" thereto means extending in any direction that is not on the plane P. In other words, the direction that the fiber members 40 extend makes an angle θ of 0° or more but less than 90° with the direction L that the sandwiching portion 21c or 21d extends. As will be described later, from the standpoint of enhancing the strength of the sandwiching portion 21c or 21d, the angle θ is preferably small. For example, the angle θ is preferably not less than 0° and not more than 15°, more preferably not less than 0° and not more than 10°, and still more preferably not less than 0° and not more than 5°.

In the present embodiment, as shown in FIGS. 2A, 2B, 2C, 2D, 2E, and 2F, one of the fiber members 40 is located inside the sandwiching portion 21c, including inside the adjoining region 21cr of the sandwiching portion 21c. Another fiber member 40 is located inside the sandwiching portion 21d, including inside the adjoining region 21dr of the sandwiching portion 21d. The fiber members 40 located inside the adjoining regions 21cr and 21dr each have a length greater than a distance between the first conductive member 31 and the second conductive member 32. More specifically, the base body 11 includes four fiber members 40, such that the four fiber members 40 are respectively embedded in the sandwiching portions 21c and 21d and the interconnecting portions 21e and 21f, along the directions that the sandwiching portions 21c, 21d, 21e, and 21f extend. Since the fiber members 40 are embedded in the sandwiching portions 21c and 21d along the direction L that the sandwiching portion 21c or 21d extends, the direction that the fiber members 40 extend is parallel to the direction L that the sandwiching portion 21c or 21d extends. In other words, the direction that the fiber members 40 in the sandwiching portions 21c and 21d extend is a direction which is non-orthogonal to the direction that the sandwiching portion 21c or 21d extends. This further enhances the strength of the base body 11.

End faces of the fiber members 40 embedded in the sandwiching portions 21c and 21d are exposed at the outer lateral faces 10e and 10f. End faces of the fiber members 40 embedded in the interconnecting portions 21e and 21f are exposed at the outer lateral faces 10c and 10d. Moreover, within the sandwiching portions 21c and 21d and the interconnecting portions 21e and 21f, the fiber members 40 are located downward (i.e., closer to the lower face 10b) of the extending portions 31h and 32h of the first conductive member 31 and the second conductive member 32). Preferably, the fiber members 40 are closely located to the lower face 10b, for greater enhancement in the strength of the base body 11. Moreover, the fiber members 40 may be located upward (i.e., closer to the upper face 10a) of the extending portions 31h and 32h).

Each fiber member 40 may be a monofilament, or a bundle of multiple fibers, e.g., a parallel fiber bundle or a twisted thread. From the standpoint of capability of impregnation with resin and the standpoint of joining with the resin, a bundle of fibers is more preferable. In the case where the fiber member 40 is a monofilament, the direction that the fiber member 40 extends coincides with the direction of the monofilament. In the case where the fiber member 40 is a bundle of fibers, the direction that the fiber member 40 extends may not necessarily coincide with the direction of the respective fibers constituting the bundle of fibers. A twisted thread can be formed by stranding together short fibers or long fibers. When twisted, the orientation of each fiber in the bundle of fibers will not be identical with the direction that the bundle of fibers itself extends; it will be inclined in the case of short fibers, or helical in the case of long fibers. As the fibers in a bundle of fibers, organic fibers such as glass fibers, carbon fibers, or aramid fibers (synthetic fibers or natural fibers) may be used. One kind of fiber, or a combination of a plurality of kinds of fibers may be used. Long fibers are preferable to short fibers, because the initial tensile resistance (apparent Young's modulus, initial elastic modulus) of the fiber members 40 will be increased.

In order to keep the bundle of fibers together, or improve its handling, each fiber member 40 may contain resin, such that a monofilament or a bundle of fibers is impregnated with the resin. Moreover, as will be described later, each fiber member 40 may constitute a knotless net, a plain weave, or the like. The thickness of each fiber member 40 is preferably smaller than the depth of the lateral peripheral grooves 31g and 32g. A knotless net is fibers being stranded (or woven) into a net form, including e.g. a perforation type knotless net, a staggered knotless net, a hexagonal knotless net, a Raschel net, a minnow net, and the like. A knotless net is preferable because it has not knots and therefore presents planar joints.

[Light-Emitting Element]

As the light-emitting element 50, a semiconductor light-emitting element such as a light-emitting diode device can be used. Although the present embodiment illustrates that the light emitting device 101 includes one light-emitting element, it may include two light-emitting elements, or three or more light-emitting elements. It is particularly preferable that the light-emitting element 50 contains a III-V group compound semiconductor, e.g., a nitride semiconductor (In$_x$Al$_y$Ga$_{1-x-y}$N, 0≤x, 0≤y, x+y≤1), that is capable of light emission in the ultraviolet to visible ranges.

In the recess 11r, the light-emitting element 50 is connected to the first conductive member 31 by a connecting member, thus being disposed on the first conductive member 31. The connecting member may be, for example: resins including the resin materials exemplified for the resin body 20; tin-bismuth based, tin-copper based, tin-silver based, gold-tin based, or other solders; electrically conductive pastes or bumps, e.g., silver, gold, or palladium; or brazing materials such as anisotropic conductive materials or low-melting point metal materials. The light-emitting element 50 and the first conductive member 31 and the second conductive member 32 may also be electrically connected via wires 51 and 52.

[Sealing Member]

The sealing member 60 transmits light from the light-emitting element 50, and yet protects the light-emitting element 50 from the external environment. As the sealing member, a resin, glass, etc., that is selected from the group consisting of epoxy resins, modified epoxy resins, silicone resins, modified silicone resins, acrylate resins, and urethane resins can be used.

In order to confer certain functions to the sealing member 60, the sealing member 60 may contain at least one selected from the group consisting of a wavelength-converting substance, a filler, a diffusing agent, a pigment, a fluorescent substance, and a reflective substance. As the diffusing agent, barium titanate, titanium oxide, aluminum oxide, silicon oxide, or the like can be suitably used. For the purpose of suppressing light of unwanted wavelengths, an organic or inorganic coloring dye or a coloring pigment may be contained. A wavelength-converting substance absorbs light from the semiconductor light-emitting element, and effects wavelength conversion into light of a different wavelength, which may be e.g. particles of nitride-based phosphor, oxynitride-based phosphor, SiAlON-based phosphor, or the like. One kind of wavelength-converting substance, or two or more kinds of wavelength-converting substances in combination, may be used in order to realize not only blue, green, yellow, red, etc., but also intermediate colors therebetween, such as blue-green, yellow-green, orange, etc.

The light emitting device 101 may further include a protection element such as a Zener diode. In this case, the protection element can be placed on the first conductive member 31 or the second conductive member 32. In this case, within the recess 11r, the protection element is also covered by the sealing member 60. Alternatively, the protection element may be placed inside the resin body 20.

[Characteristic Aspects of the Light Emitting Device]

In the light emitting device 101, the isolation section 21j of the resin body 20 is located in the gap between the first conductive member 31 and the second conductive member 32. Therefore, as the light emitting device 101 is picked up by a chip mounter, etc., during mounting of the light emitting device 101, the base body 11 of the light emitting device 101 may be stressed, thereby likely causing fissures, cracks, etc., at the position of the isolation section 21j. In the light emitting device 101 according to the present disclosure, the fiber members 40 are placed in the adjoining regions 21cr and 21dr of the sandwiching portions 21c and 21d, which adjoin the isolation section 21j, whereby the strength of the adjoining regions 21cr and 21dr of the sandwiching portions 21c and 21d is enhanced, so that fissures, cracks, etc., due to stress can be suppressed. Moreover, since the fiber members 40 are placed in the entirety of each sandwiching portion 21c, 21d and each interconnecting portion 21e, 21f, the strength of the entire resin body 20 is enhanced. As a result, with the light emitting device 101 according to the present disclosure, malfunctioning due to external force is suppressed, and reliability can be enhanced. Moreover, various fillers may be adequately added to the resin body 20 in order to confer thereto functions such as light reflectivity, light-shielding ability, etc.; thus, optical characteristics of the light emitting device 101 can be further enhanced.

[Method of Manufacturing the Light Emitting Device]

The light emitting device 101 can be produced by: step (A) of manufacturing a resin-attached lead frame in which base bodies 11 as aforementioned are integrated; step (B) of placing a light-emitting element 50 in the recess 11r of each base body 11 in the resin-attached lead frame, and electrically connecting the light-emitting element 50 with a first conductive portion to become the first conductive member 31 and a second conductive portion to become the second conductive member 32; step (C) of placing a sealing member 60 so as to cover the light-emitting element 50 in the recess 11r; and step (D) of singulating the resin-attached lead frame by cutting it along cut lines, thereby obtaining individual light emitting devices 101. Hereinafter, the respective steps will be described in order.

Step (A)

[Structure of the Resin-Attached Lead Frame and Method of Manufacturing the Resin-Attached Lead Frame]

Figure 4A:
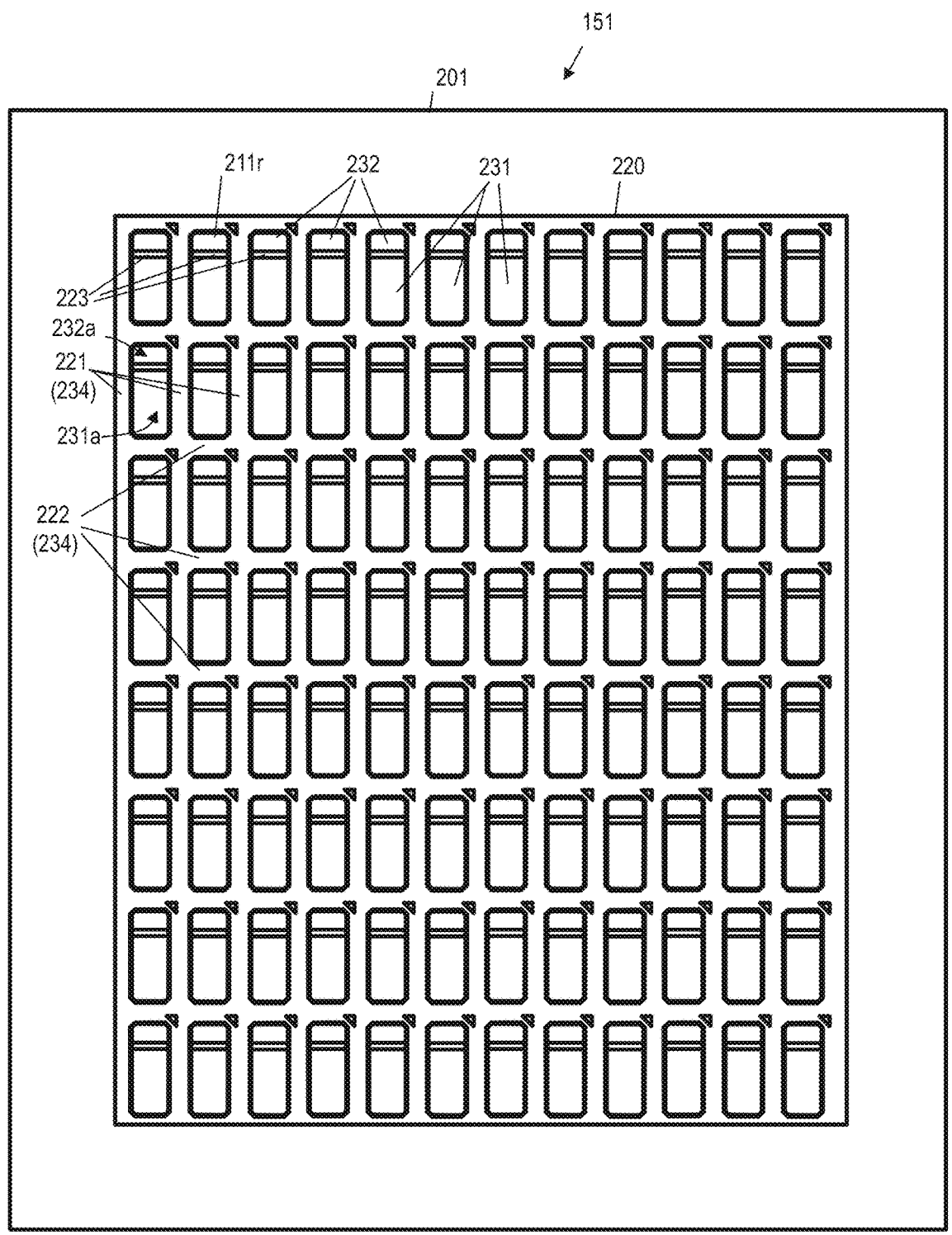
FIG. 4A is an upper plan view of a resin-attached lead frame which is used for manufacturing the light emitting device of FIG. 1.
Figure 4B:
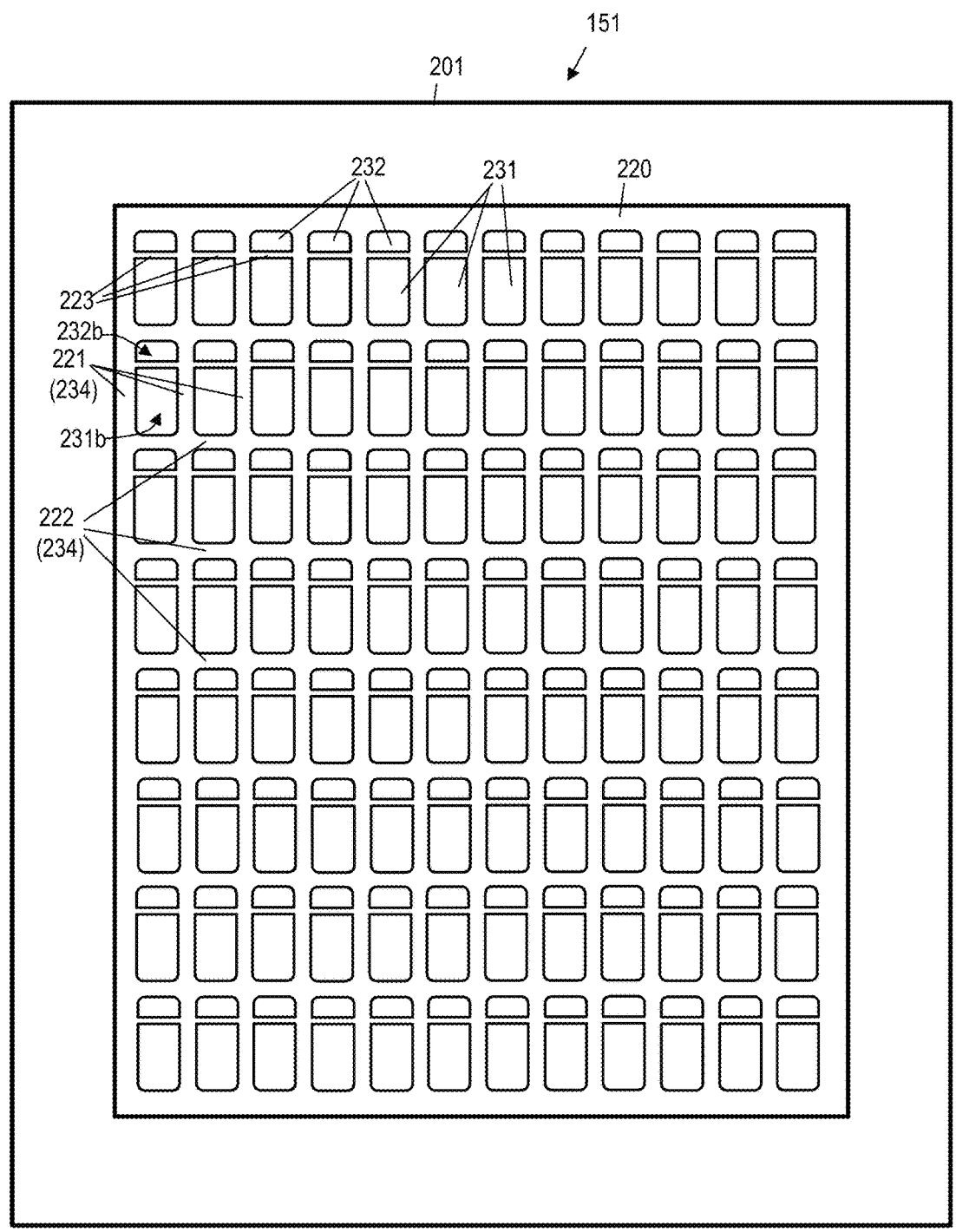
FIG. 4B is a lower plan view of a resin-attached lead frame which is used for manufacturing the light emitting device of FIG. 1.
Figure 4C:
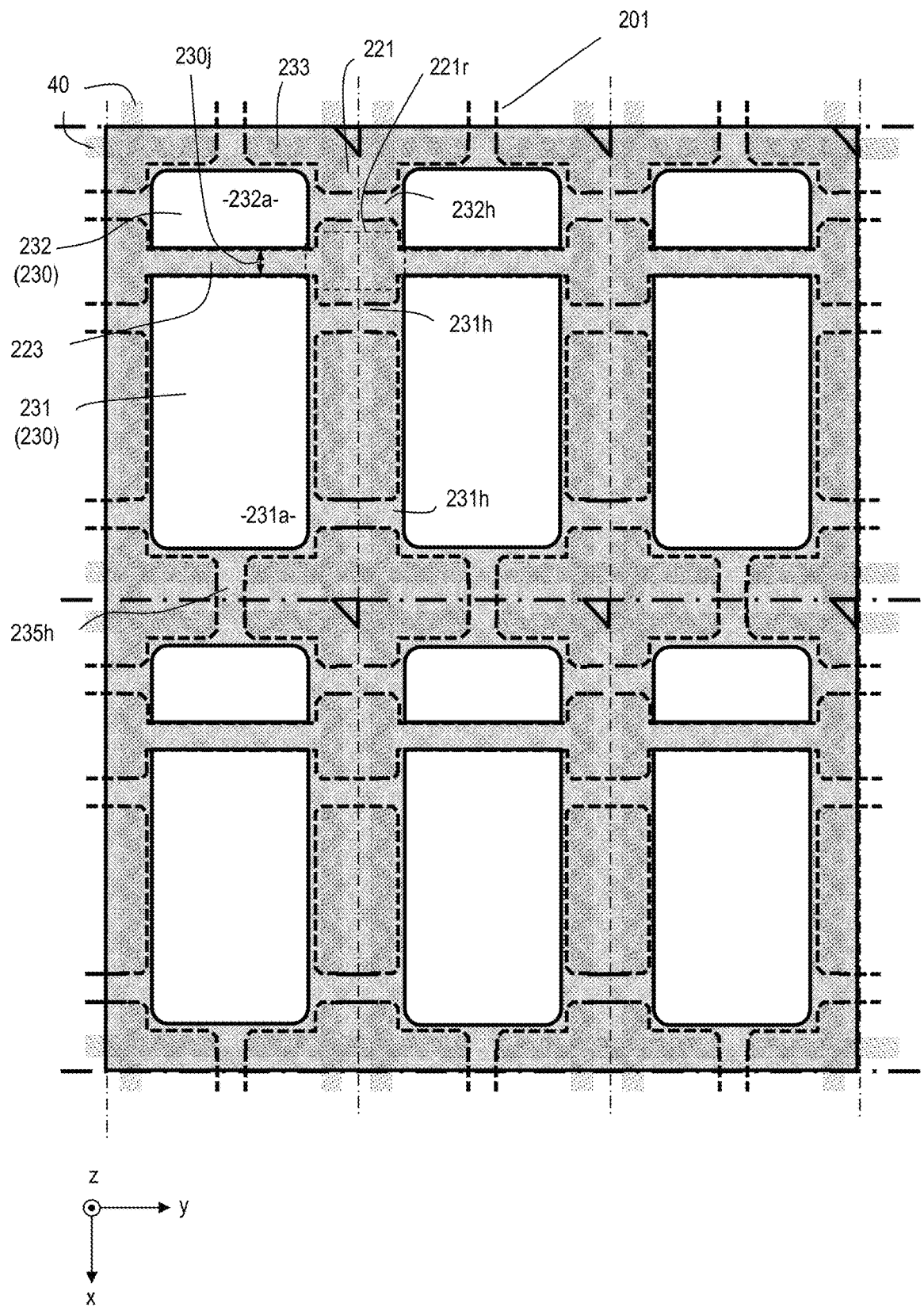
FIG. 4C is an enlarged upper plan view in which a part of a resin-attached lead frame which is used for manufacturing the light emitting device of FIG. 1 is shown enlarged, and its internal structure is indicated with broken lines.
Figure 5A:
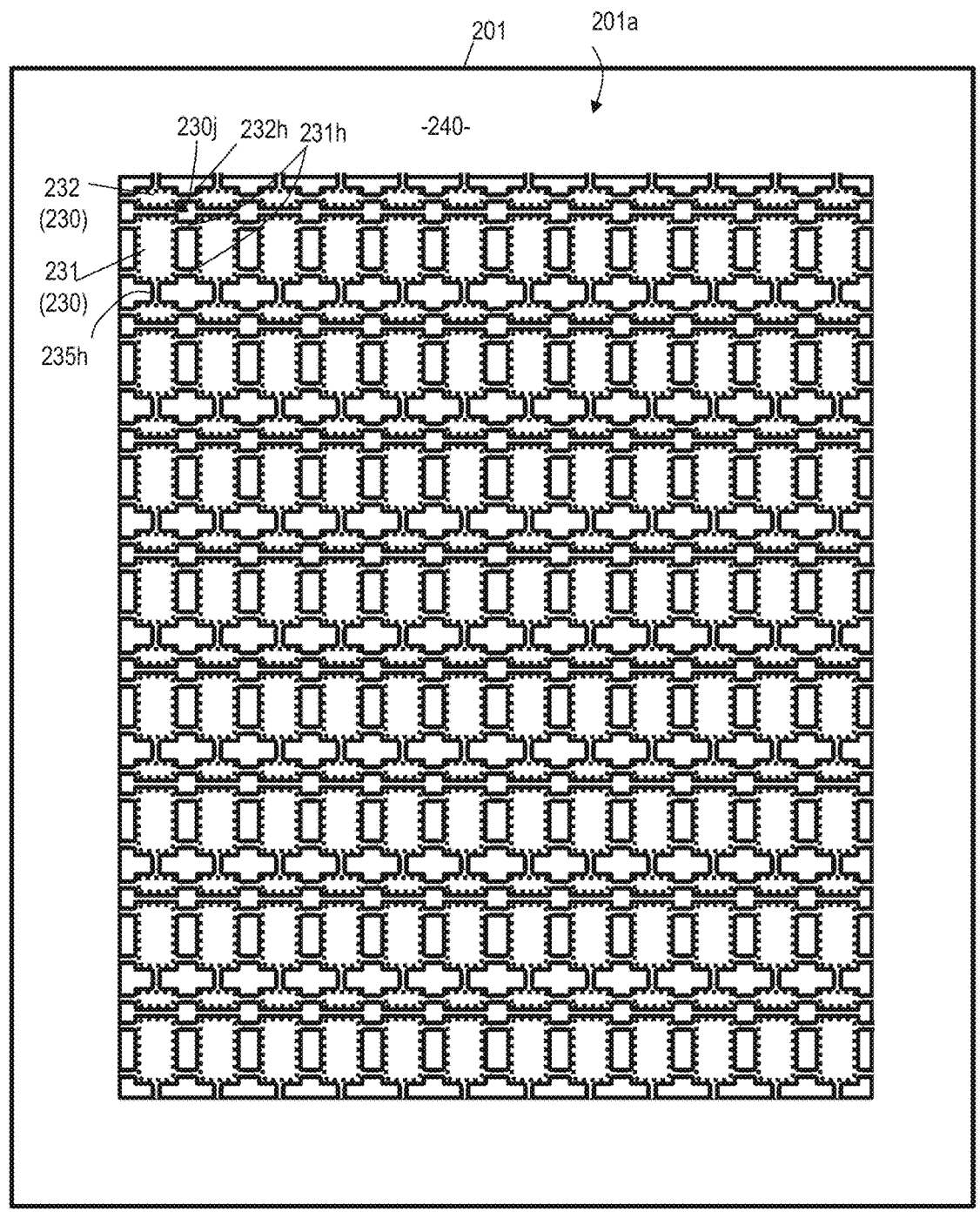
FIG. 5A is an upper plan view of a lead frame which is used for manufacturing the light emitting device of FIG. 1.

FIG. 4A and FIG. 4B are an upper plan view and a lower plan view, respectively, of the resin-attached lead frame 151. FIG. 4C is an enlarged upper plan view in which a part of the resin-attached lead frame is shown enlarged, and its internal structure is indicated with broken lines. FIG. 5A is an upper plan view of a lead frame which is used for the resin-attached lead frame 151. In these figures, for ease of understanding, three-dimensional directions are indicated by a right-hand orthogonal coordinate system. Specifically, in each diagram, the downward direction along the vertical direction is represented as the x axis, whereas the rightward direction, which is perpendicular to the x axis, is represented as the y axis. Moreover, a direction which is perpendicular to the x axis and the y axis and coming out of the plane of the figure is defined as the z axis. These may instead be referred to as the first, second, and third axes. The first axis and the second axis may not be orthogonal to each other. Moreover, any arrangement along the x axis direction will be referred to as a column, and any arrangement along the y axis direction will be referred to as a row. A direction which is parallel to the x axis direction may be referred to as the first direction; a direction which is parallel to the y axis direction may be referred to as the second direction; and a direction which is parallel to the z axis direction may be referred to as the third direction.

The resin-attached lead frame 151 includes a lead frame 201, a resin member 220, and fiber members 40. The lead frame 201 includes a plurality of conductive portions 230. The plurality of conductive portions 230 are arrayed along the x axis and the y axis direction. Each conductive portion 230 includes a plurality of conductive subportions that are arranged along the x axis direction. In the present embodiment, each conductive portion 230 includes a first conductive subportion 231 and a second conductive subportion 232. The first conductive subportion 231 has an upper face 231a and a lower face 231b, whereas the second conductive subportion 232 has an upper face 232a and a lower face 232b. When the resin-attached lead frame 151 is singulated, i.e., separated into a plurality of base bodies 11, the first conductive subportion 231 and the second conductive subportion 232 are to become the first conductive member 31 and the second conductive member 32 of each base body 11.

In the lead frame 201, the first conductive subportions 231 and the second conductive subportions 232 are alternately arranged along the x axis direction. A plurality of first conductive subportions 231 are arranged along the y axis direction, and a plurality of second conductive subportions 232 are arranged along the y axis direction. Along the x axis direction, the first conductive subportion 231 and the second conductive subportion 232 of each conductive portion 230 are spaced apart from each other by a gap 230j in which the isolation portion 223 of the resin member is placed. At the lower face side of the first conductive subportion 231 and the second conductive subportion 232, lateral peripheral grooves 231g and 232g corresponding to the lateral peripheral grooves 31g and 32g are provided.

Each conductive portion 230 is connected to an adjacent conductive portion 230 along the x axis direction or the y axis direction, via connecting portions 231h, 232h and 235h. In the present embodiment, the first conductive subportion 231 is connected to the first conductive subportion 231 of an adjacent conductive portion 230 on the right (or left) side along the y axis direction, via two connecting portions 231h. The second conductive subportion 232 is connected to the second conductive subportion 232 of an adjacent conductive portion 230 on the right (or left) side along the y axis direction, via a single connecting portion 232h. On the other hand, along the x axis direction, the first conductive subportion 231 is connected to the second conductive subportion 232 of an adjacent conductive portion 230 via a connecting portion 235h. Regarding the z axis direction, each conductive portion 230 has an upper face and a lower face.

The array of plural sets of conductive portions 230 along the x axis direction and the y axis direction is connected, by connecting portions 231h, 232h and 235h, to an outer frame portion 240 that surrounds the array of plural sets of conductive portions 230.

By using a plate made of any of the materials exemplified for the substrate of the first conductive member 31 and the second conductive member 32, the lead frame 201 can be formed by performing a stamping process, an etching process, or the like to create incisions, steps, and concavities and convexities. The incisions, steps, and concavities and convexities can be created by combining stamping processes and/or pressing processes. In the case where etching processes are to be performed, an etching process to penetrate through the lead frame and a one-sided etching process which stops short of penetration may be combined to create the incisions, steps, and concavities and convexities. Thereafter, the surface of the plate of the processed substrate may be covered with a metal layer, thereby providing the lead frame 201. As obtained above, the lead frame is provided.

The resin member 220 includes a plurality of first portions 221, a plurality of second portions 222 (see FIGS. 4A and 4B), and a plurality of isolation portions 223. Each first portion 221 extends along the first direction, and is placed between each column of conductive portions 230 that are arranged along the x axis direction. Each second portion 222 extends along the second direction intersecting the first direction, and is placed between each row of conductive portions 230 that are arranged along the y axis direction. Each isolation portion 223 is placed between the first conductive subportion 231 and the second conductive subportion 232 of the respective conductive portion 230. The first portions 221 and the second portions 222 surround each conductive portion 230 and each isolation portion 223, thereby constituting a latticework portion 234. On the upper face side of the latticework portion 234, a plurality of recesses 211r each corresponding to the recess 11r of the base body 11 are located. At the bottom face of each recess 211r, a part of the upper face 231a of the first conductive subportion 231 and a part of the upper face 232a of the second conductive subportion 232 are exposed. Also, the isolation portion 223 is exposed at the bottom of the recess 211r. On the lower face side of the latticework portion 234, a part of the lower face 231b of the first conductive subportion 231 and a part of the lower face 232b of the second conductive subportion 232 are exposed. One end and the other end of each isolation portion 223 are connected to the respective first portions 221 on its right and left sides, such that each first portion 221 includes an adjoining region 221r (see FIG. 4C) adjoining the isolation portion 223.

When the resin-attached lead frame 151 is singulated, i.e., separated into a plurality of base bodies 11, the resin member 220 becomes the resin body 20 of each base body 11. Moreover, the first portions 221 become the sandwiching portions 21c and 21d of each resin body 20, and the second portions 222 become the interconnecting portions 21e and 21f of each resin body 20. The resin member 220 is made of the material of the resin body 20 as aforementioned.

Within each first portion 221 of the resin member 220, fiber members 40 are placed, at least inside the adjoining region 221r. Each fiber member 40 placed inside the adjoining region 221r has a length which is greater than a distance between the first conductive subportion 231 and the second conductive subportion 232. The fiber members 40 extend in a direction which is non-orthogonal to the x axis direction. Since the first portions 221 extend along the first direction which is parallel to the x axis direction, the fiber members 40 extend so as to intersect the yz plane, which is perpendicular to the x axis. In the present embodiment, fiber members 40 are placed on each of the four sides surrounding each recess 211r of the resin member 220. Specifically, each first portion 221 has two fiber members 40 embedded therein, such that the two fiber members 40 respectively adjoin the two columns of conductive portions 230 that are adjacent to the first portion 221 on its both sides along the y axis direction. Moreover, each second portion 222 has two fiber members 40 embedded therein, such that the two fiber members 40 respectively adjoin the two rows of conductive portions 230 that are adjacent to the second portion 222 on its both sides along the x axis direction.

In the resin-attached lead frame 151, the two fiber members 40 are embedded inside the adjoining region 221r of each first portion 221. As a result, when the resin-attached lead frame 151 is singulated into base bodies 11 by cutting each first portion 221 apart between the two fiber members 40 (and also cutting apart each second portion 222), the base bodies 11 will possess the aforementioned characteristic aspects.

The resin-attached lead frame 151 is produced by insert molding, for example.

Figure 5B:
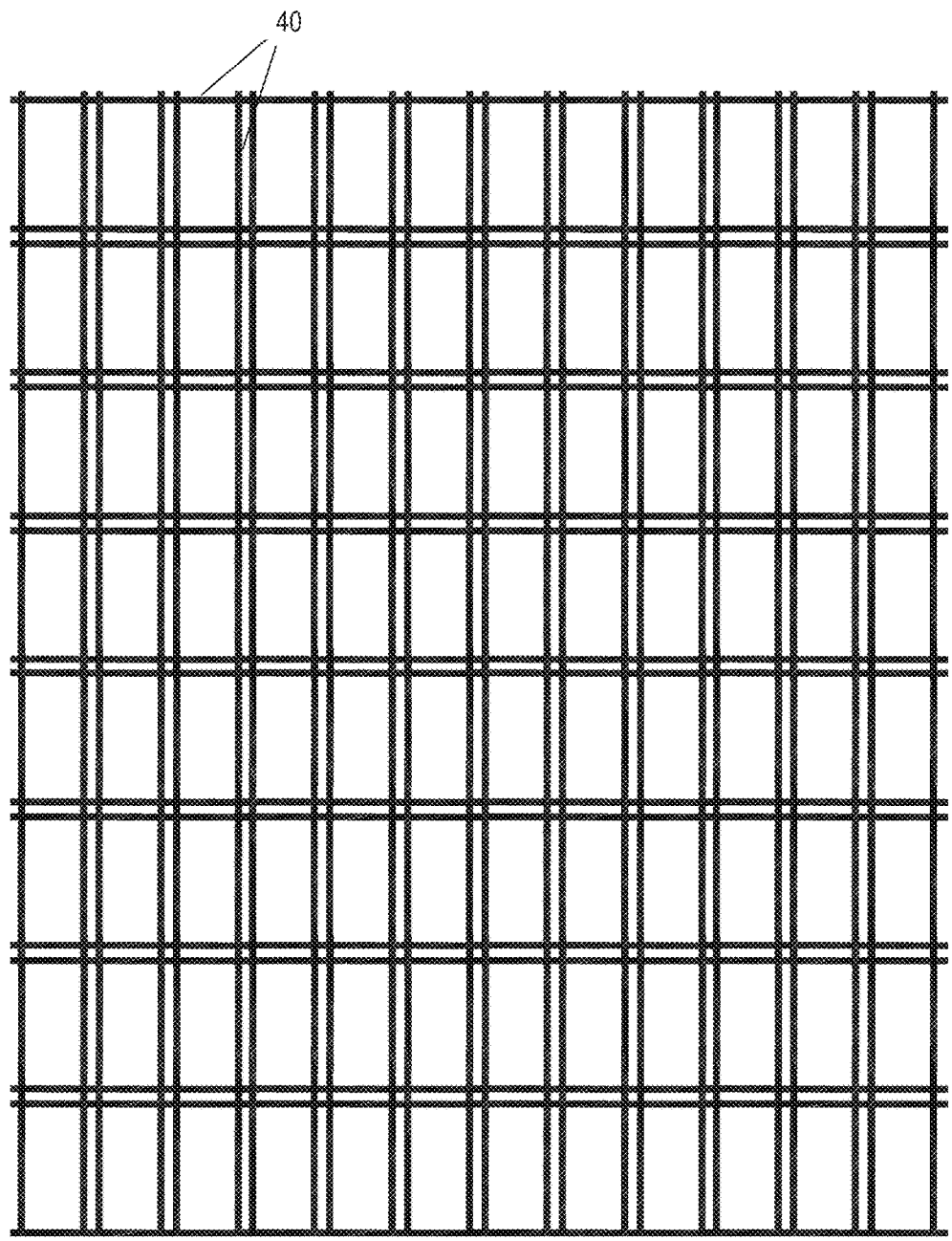
FIG. 5B is an upper plan view of a plurality of fiber members which are used for manufacturing the light emitting device of FIG. 1.

First, as shown in FIG. 5A, the lead frame 201 having the above-described structure is provided. Moreover, as shown in FIG. 5B, an array of plural fiber members 40 arranged along the x axis direction and the y axis direction is provided. At this time, the plurality of fiber members 40 may be arrayed along the x axis direction and the y axis direction; the fiber members 40 may be impregnated with resin so that their respective positions are temporarily fixed; and the resin may be semi-cured while the fiber members 40 are kept in the predetermined positions, for better temporary fixation.

Figure 5C:
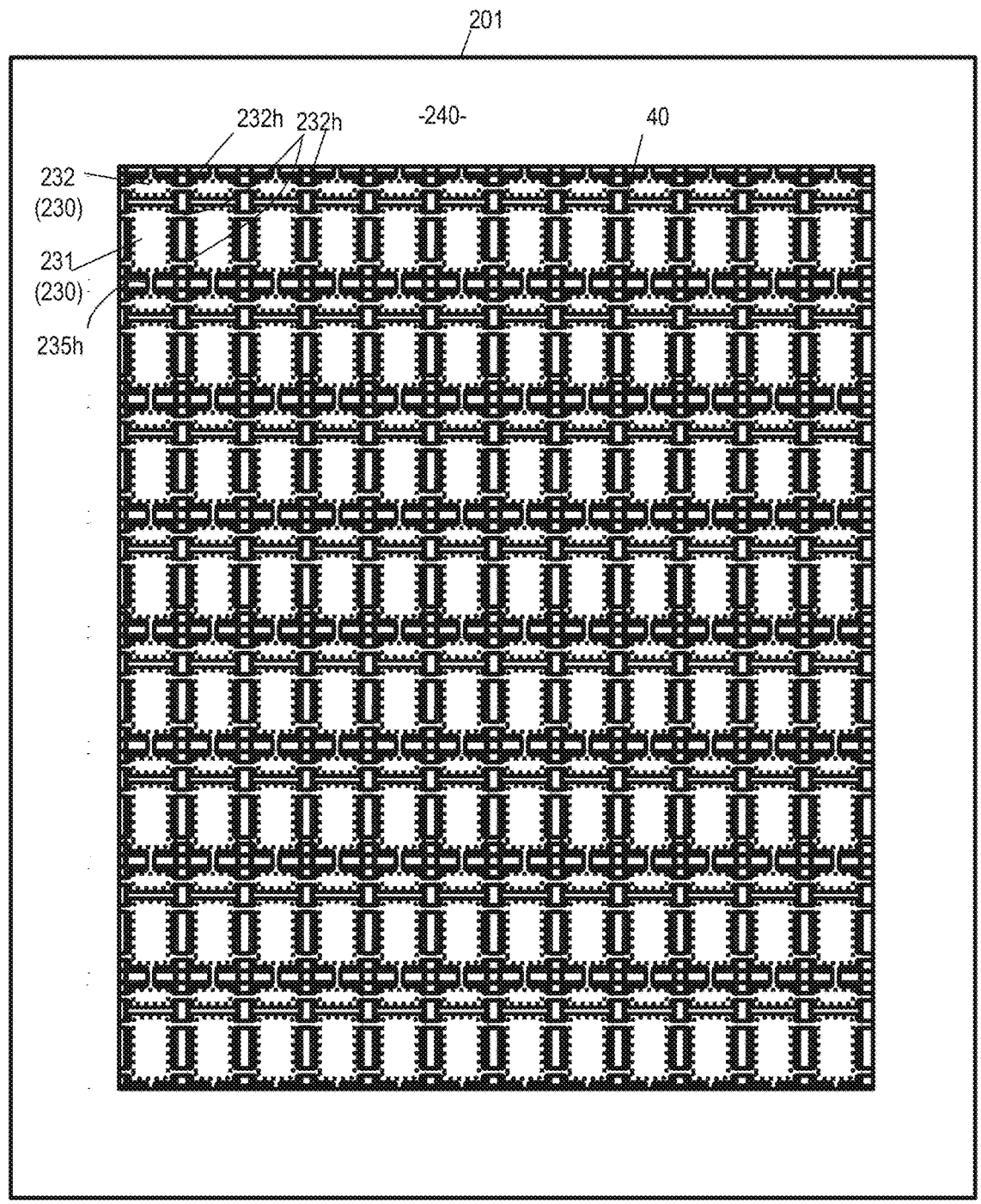
FIG. 5C is an upper plan view showing a plurality of fiber members being placed on a lead frame.

Thereafter, as shown in FIG. 5C, the lead frame 201 is overlaid on the plurality of fiber members 40. The plurality of fiber members 40 are aligned so as to overlap the connecting portions 231h, 232h, and 235h of the lead frame 201 in top view.

Figure 5D:
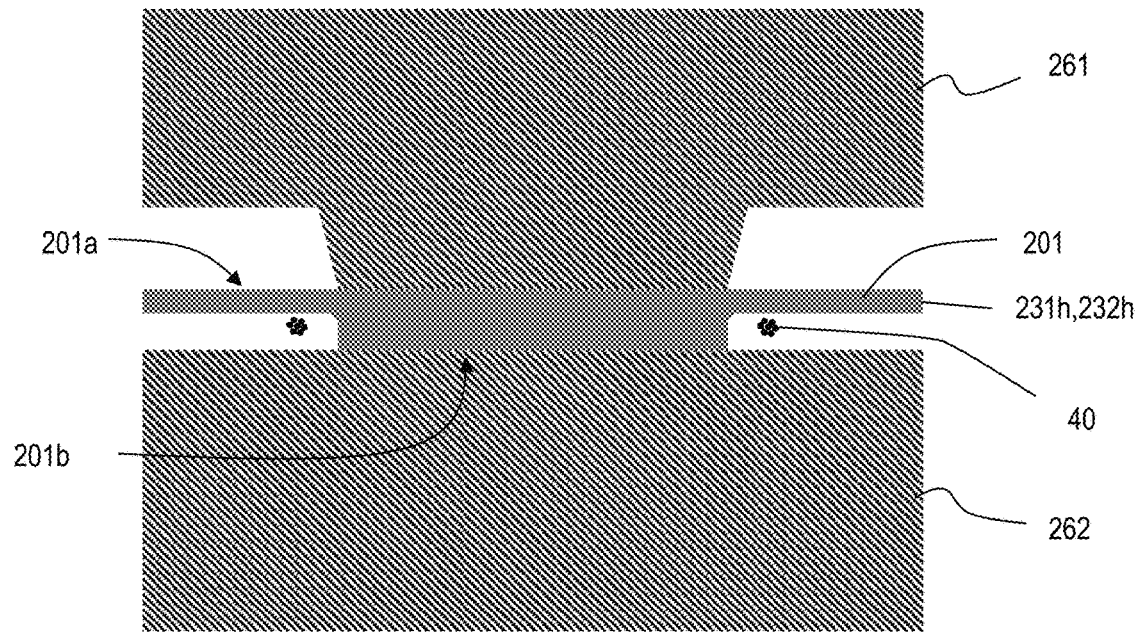
FIG. 5D is an enlarged cross-sectional view showing a lead frame and fiber members that are placed between dies.
Figure 5E:
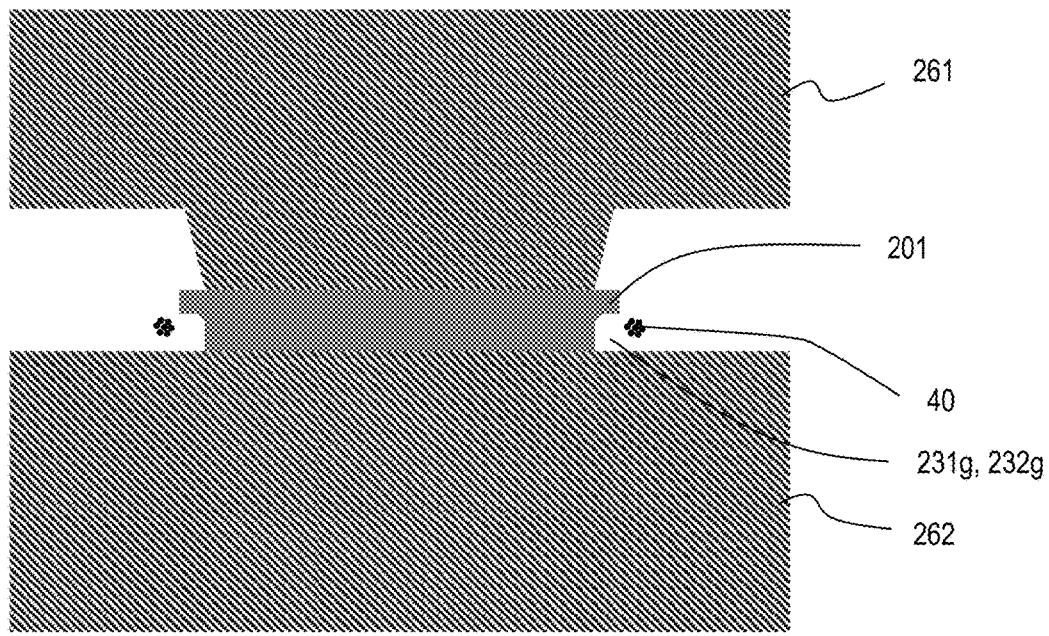
FIG. 5E is an enlarged cross-sectional view showing a lead frame and fiber members that are placed between dies.

Thereafter, as shown in FIG. 5D and FIG. 5E, the lead frame 201 and the fiber members 40 having been aligned are sandwiched between an upper die 261 and a lower die 262. As shown in FIG. 5D, the fiber members 40 are placed in a region below the connecting portions 231h, 232h and 235h (FIG. 5C); and as shown in FIG. 5E, where the connecting portions 231h, 232h, and 235h do not exist, the fiber members 40 are placed closely to the lateral peripheral grooves 231g and 232g. Cavities are created by the sandwiching positioning of the upper die 261 and the lower die 262. The cavities are spaces corresponding to the sandwiching portions 21c and 21d, the interconnecting portions 21e and 21f, and the isolation sections 21j of the resin bodies 20. Regions of the upper face 201a of the lead frame 201 that are in contact with the upper die 261 are regions of the conductive members 30 that will become exposed at the respective bottom faces of the recesses 211r. Regions of the lower face 201b of the lead frame 201 that are in contact with the lower die 262 are regions of the conductive members 30 that will become exposed at the respective lower faces of the base bodies 11.

Next, in the cavities sandwiched between the upper die 261 and the lower die 262, an uncured material of the resin body 20 is injected and heated, thereby allowing the uncured material of the resin body 20 to cure. Thereafter, the dies 261 and 262 are removed, whereby the resin-attached lead frame 151 is completed.

Step (B)

The light-emitting elements 50 are placed on the lead frame 201. Each light-emitting element 50 is joined to the first conductive subportion 231 that is exposed in the respective recess 211r in the resin-attached lead frame 151. Furthermore, each light-emitting element 50 is connected to the first conductive subportion 231 and the second conductive subportion 232 via wires 51 and 52.

Step (C)

Furthermore, an uncured material of the sealing member 60 is injected in each recess 211r so as to cover the light-emitting element 50 and the wires 51 and 52, and thereafter cured, thus allowing the sealing member 60 to be placed within the recesses 211r.

Step (D)

In order to effect singulation, the resin-attached lead frame 151 is cut along cut lines which are indicated with dot-dash lines in FIG. 4C. The resin member 220 and the fiber members 40 of the resin-attached lead frame 151, and the connecting portions 231h, 232h, and 235h of the lead frame 201 are simultaneously cut. A dicing saw may be used for the cutting, for example. As a result of this, a plurality of singulated light emitting devices 101 are produced.

Figure 6:
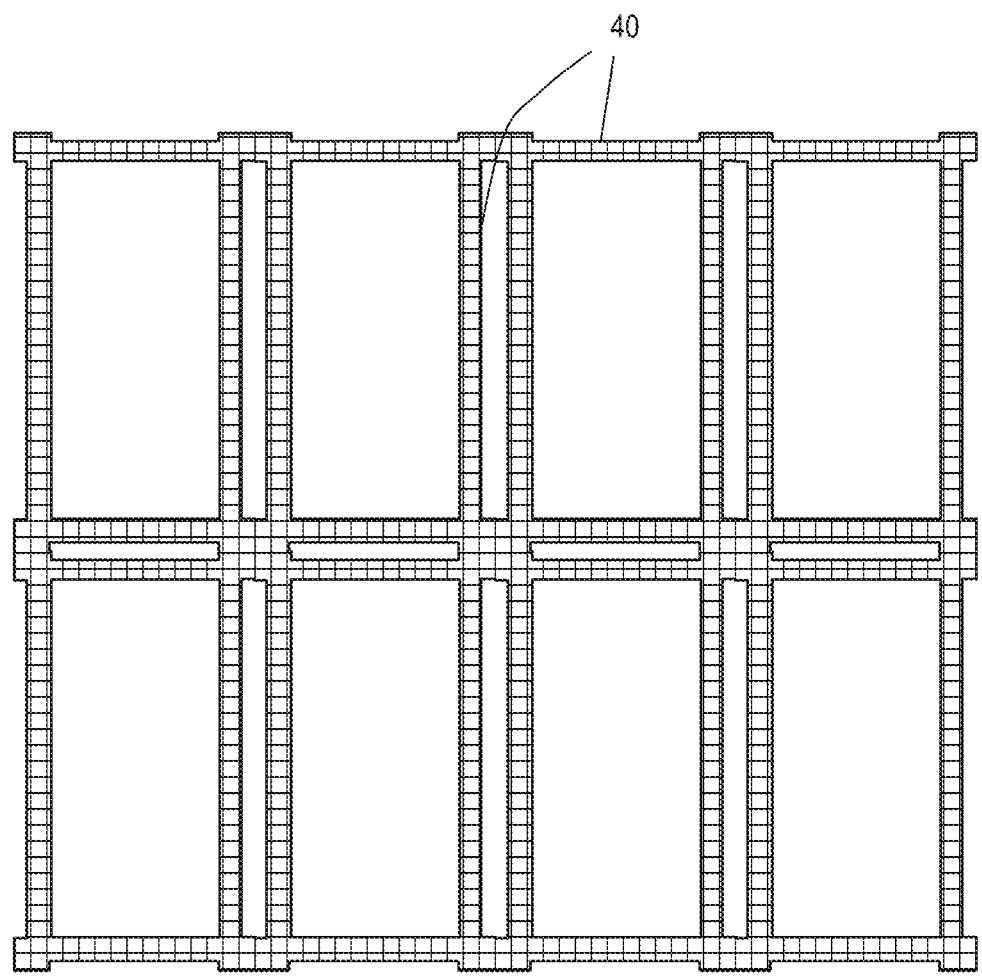
FIG. 6 is an upper plan view showing an example where fiber members are composed of a knotless net.

Although the present embodiment illustrates the each fiber member as a bundle of fibers in the figures, any of the aforementioned variety of fiber members can be used. For example, as shown in FIG. 6, holes may be formed in a knotless net, or a sheet-shaped fiber member such as a reticulated fiber or nonwoven fabric, and portions corresponding to the plurality of fiber members 40 arrayed along the x axis direction and they axis direction as illustrated in FIG. 5B may be formed therein. Using such a member will make it unnecessary to align a plurality of fiber members 40, thereby facilitating the production of the resin-attached lead frame 151.

Second Embodiment

A second embodiment of a light emitting device according to the present disclosure will be described. The light emitting device according to the second embodiment is identical to the light emitting device according to the first embodiment, except mainly for a base body having a different structure. Therefore, the structure of the base body will be mainly described.

Figure 7A:
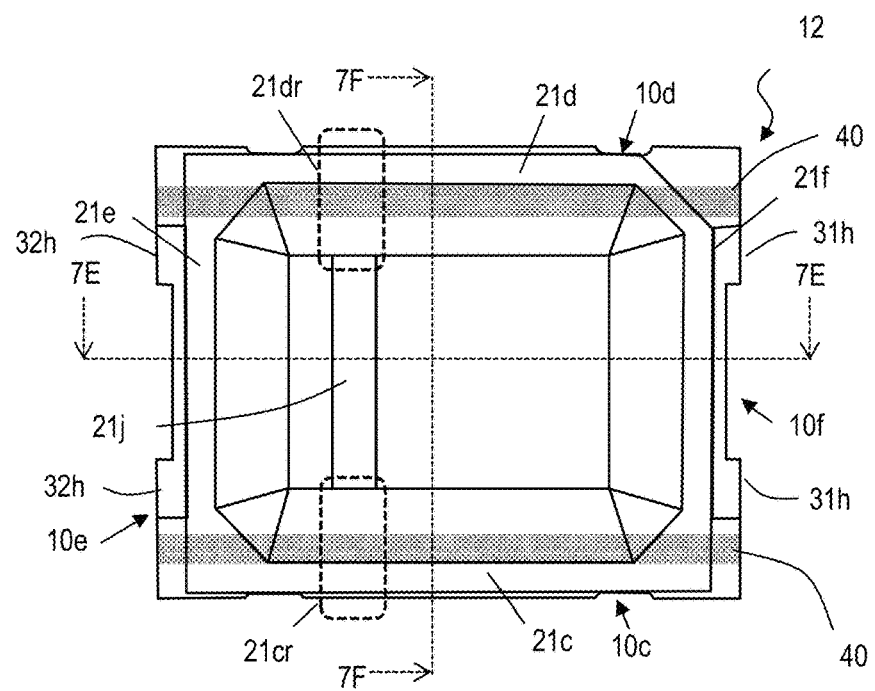
FIG. 7A is a plan view of a base body used in a light emitting device according to a second embodiment.
Figure 7B:
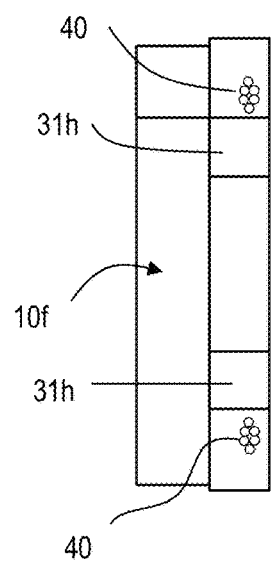
FIG. 7B is a side view of the base body used in a light emitting device according to a second embodiment.
Figure 7C:
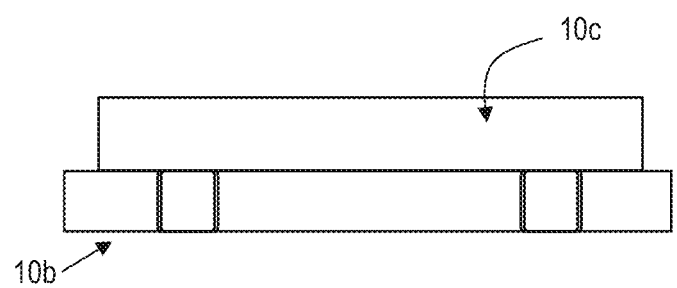
FIG. 7C is a front view of the base body used in a light emitting device according to a second embodiment.
Figure 7D:
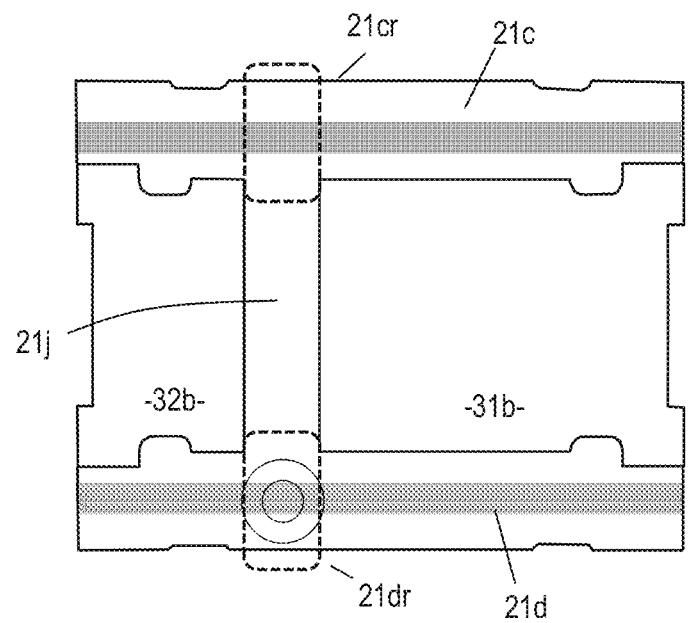
FIG. 7D is a bottom view of the base body used in a light emitting device according to a second embodiment.
Figure 7E:
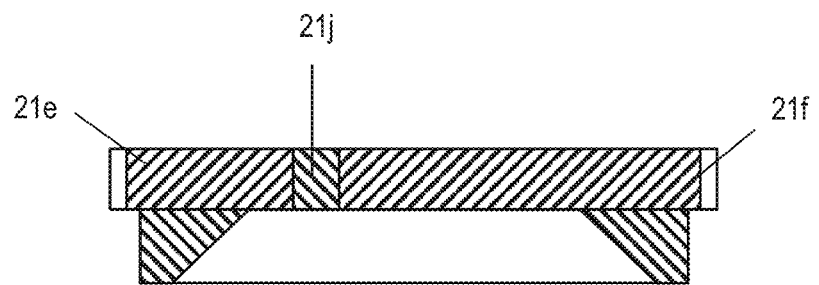
FIG. 7E is a cross-sectional view of the base body taken at line 7E-7E in FIG. 7A.
Figure 7F:
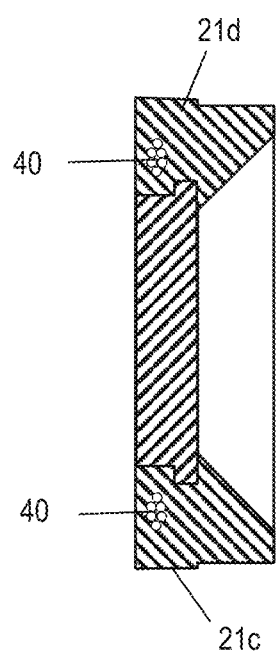
FIG. 7F is a cross-sectional view of the base body taken at line 7F-7F in FIG. 7A.

FIGS. 7A, 7B, 7C, and 7D are a plan view, a side view, a front view, and a bottom view, respectively, of a base body 12 used in the light emitting device according to the second embodiment; and FIGS. 7E and 7F are cross-sectional views of the base body 12 taken at line 7E-7E and line 7F-7F, respectively, in FIG. 7A.

End faces of extending portions 31h and 32h of the base body 12 are exposed at an outer lateral face 10e of an interconnecting portion 21e and an outer lateral face 10f of an interconnecting portion 21f, but are not exposed at an outer lateral face 10c of a sandwiching portion 21c and an outer lateral face 10d of a sandwiching portion 21d. In other words, the extending portions 31h and 32h are not provided in the sandwiching portions 21c and 21d. Moreover, fiber members 40 are embedded in the sandwiching portions 21c and 21d, but not embedded in the interconnecting portions 21e and 21f. In other words, the fiber members 40 are not provided under the extending portions 31h and 32h.

The fiber members 40 are located inside the adjoining regions 21cr and 21dr of the sandwiching portions 21c and 21d, and extend along the direction that the sandwiching portion 21c or 21d extends. In other words, the fiber members 40 extend in a direction which is non-orthogonal to the direction that the sandwiching portion 21c or 21d extends. This enhances the strength of the base body 11, as has been described in the first embodiment.

Figure 8A:
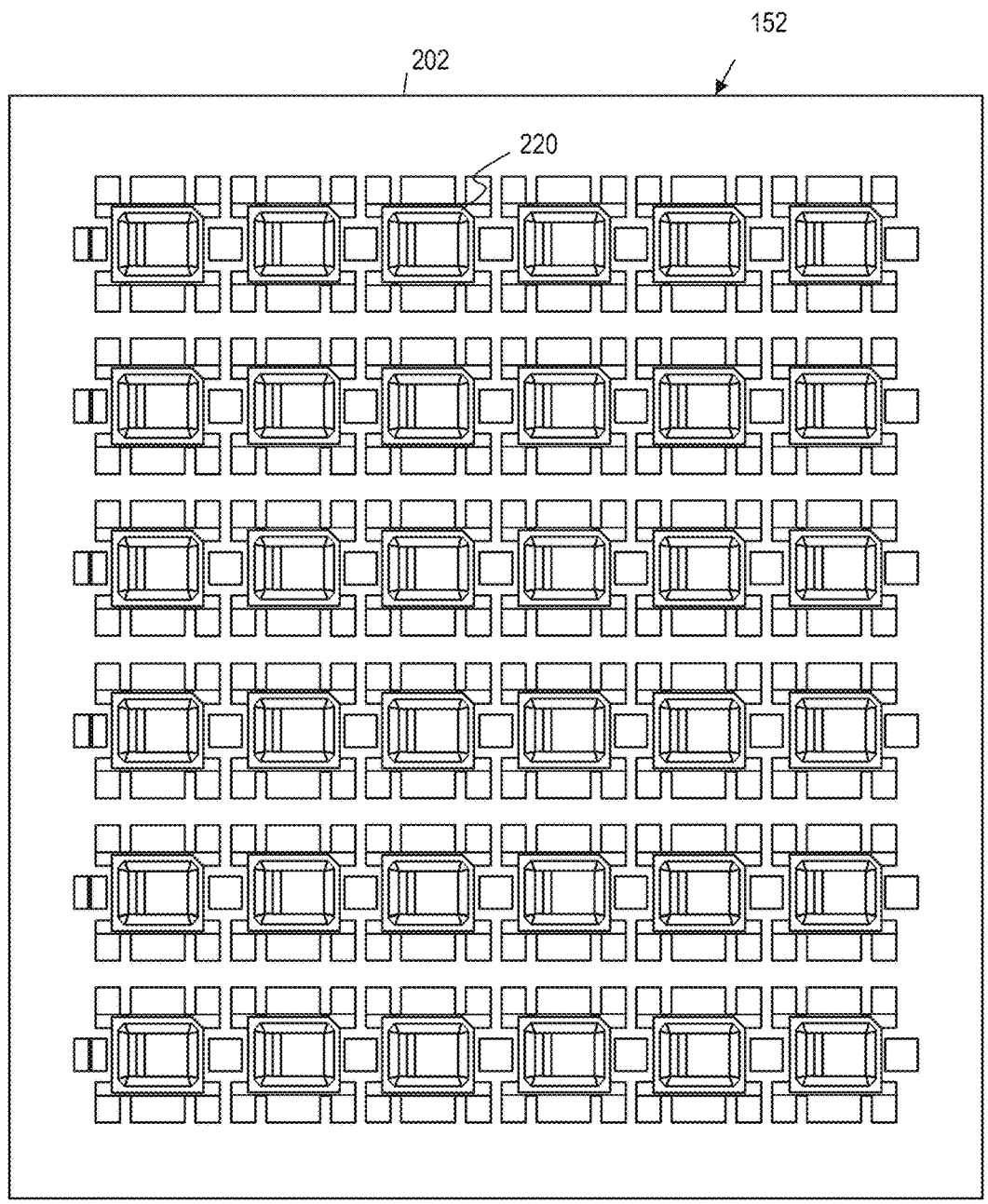
FIG. 8A is an upper plan view of a resin-attached lead frame which is used for manufacturing a second light emitting device.
Figure 8B:
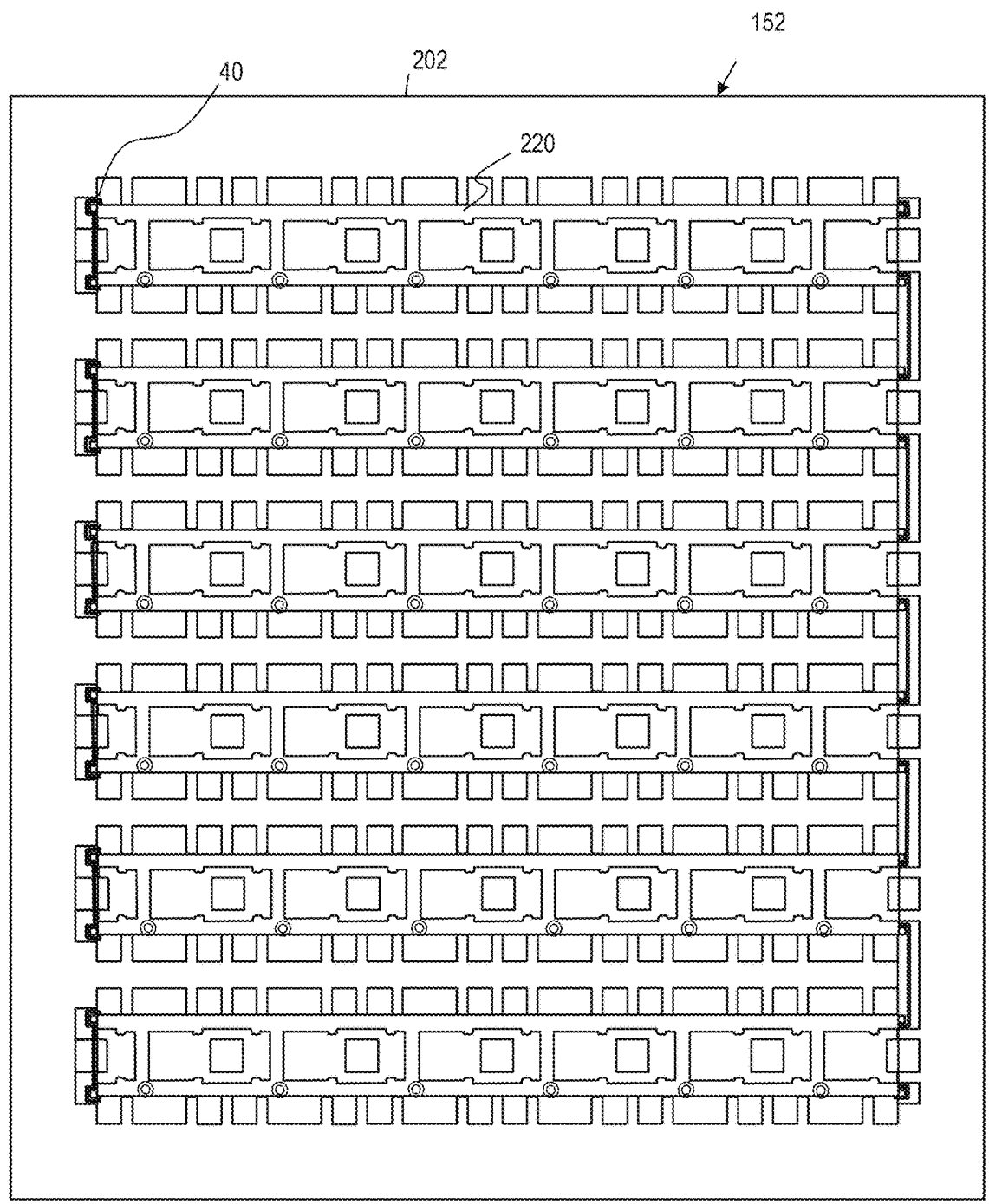
FIG. 8B is a lower plan view of a resin-attached lead frame which is used for manufacturing the second light emitting device.
Figure 9A:
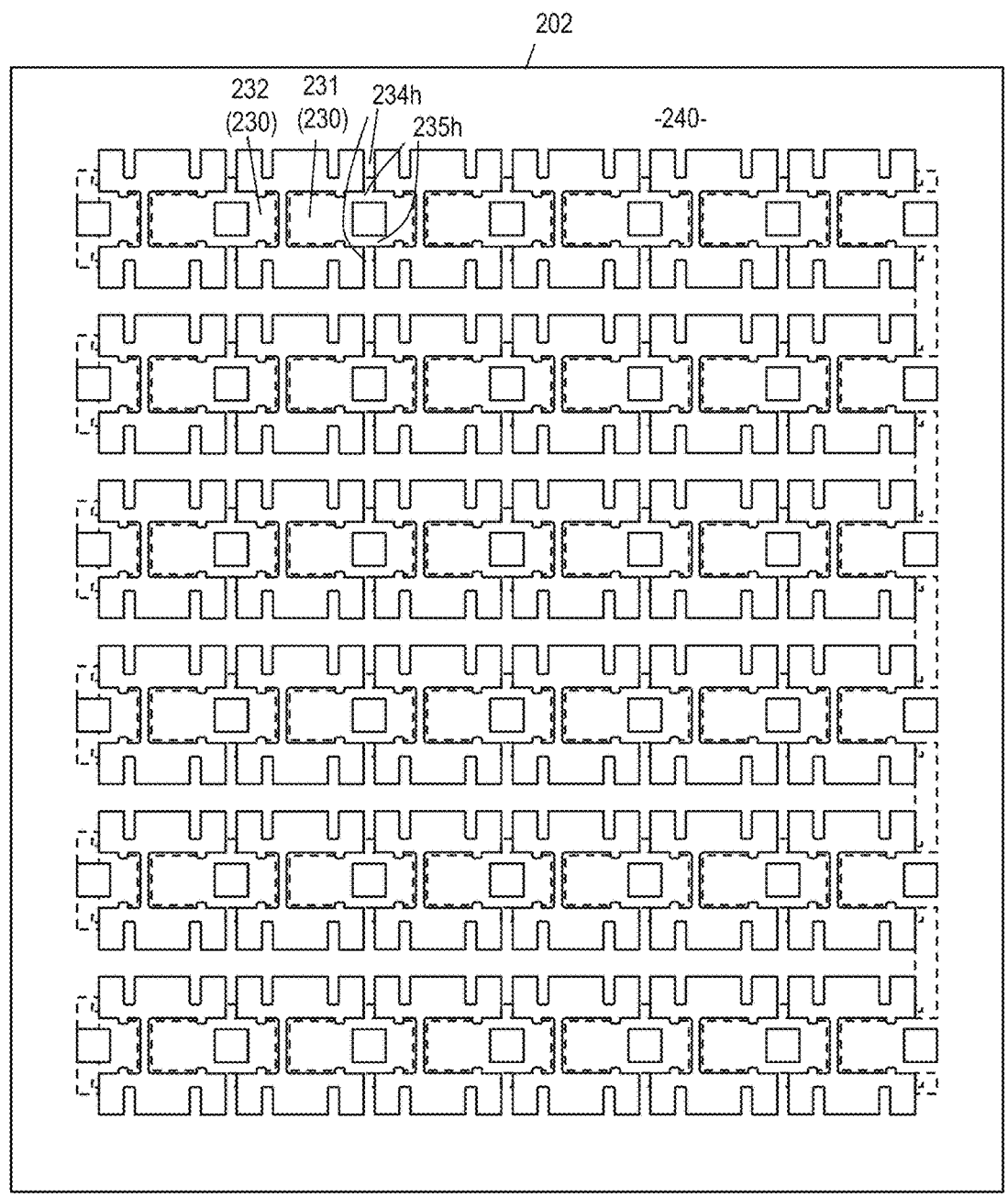
FIG. 9A is an upper plan view of a lead frame which is used for manufacturing the second light emitting device.
Figure 9B:
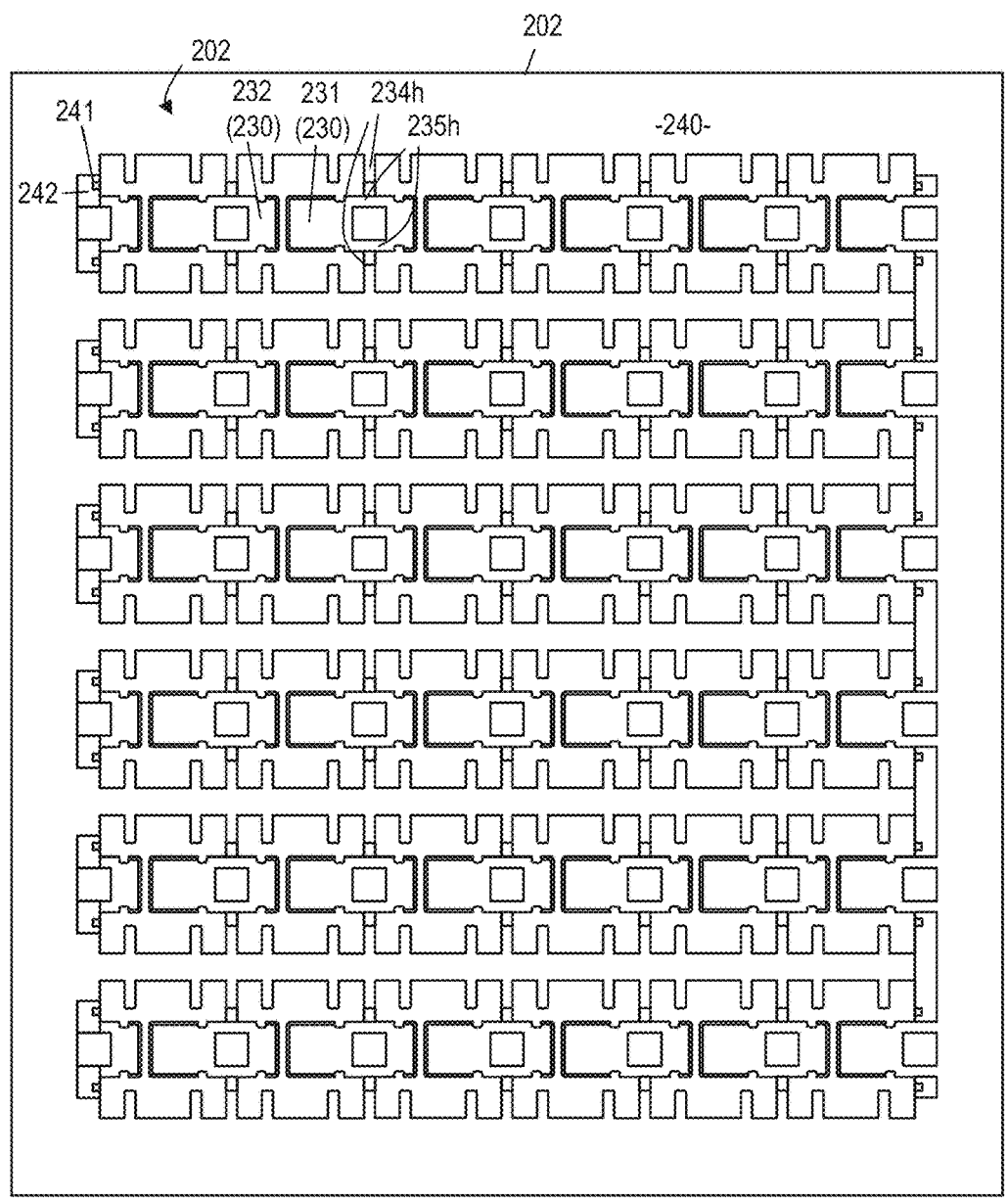
FIG. 9B is a lower plan view of a lead frame which is used for manufacturing the second light emitting device.
Figure 9C:
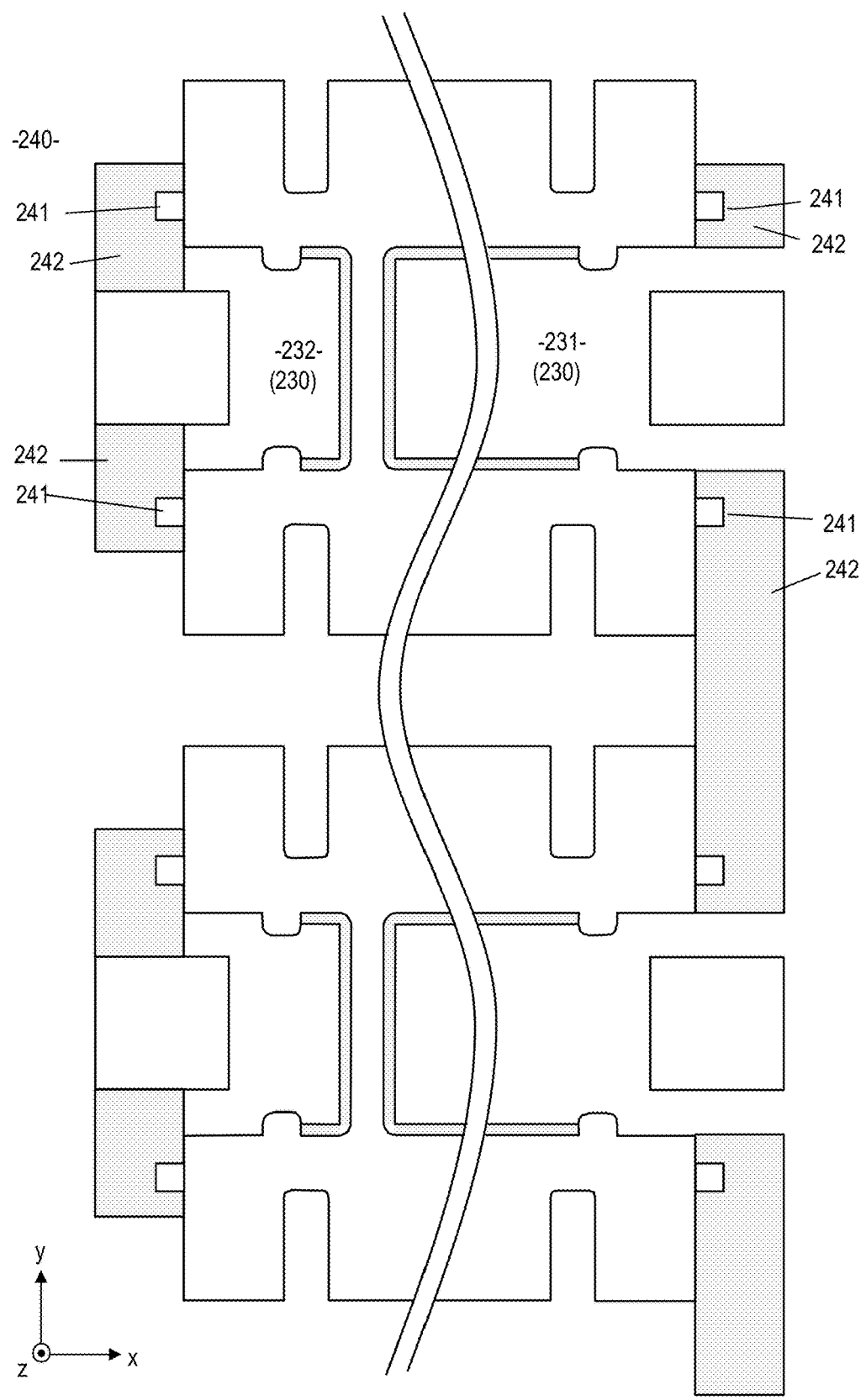
FIG. 9C is an enlarged lower plan view of a lead frame which is used for manufacturing the second light emitting device.

FIG. 8A and FIG. 8B are an upper plan view and a lower plan view, respectively, of a resin-attached lead frame 152 in which such base bodies 12 are integrated. FIG. 9A and FIG. 9B are an upper plan view and a lower plan view, respectively, of a lead frame 202 which is used in the resin-attached lead frame 152; and FIG. 9C is a partially enlarged view of the lower plan view. In these figures, the upward direction along the vertical direction is represented as the y axis, whereas the rightward direction, which is perpendicular to the y axis, is represented as the x axis.

The resin-attached lead frame 152 differs from the resin-attached lead frame 151 with respect to the structure of the lead frame 202 and placement of the fiber members 40.

In the lead frame 202, each first conductive subportion 231 is connected to the second conductive subportion 232 of an adjacent conductive portion 230, along the x axis direction, by two connecting portions 235h (see FIG. 9A). The connecting portions 235h are connected by a connecting portion 234h, along the y axis direction. Each first conductive subportion 231 and each second conductive subportion 232 are not connected, via any connecting portion, to an adjacent first conductive subportion 231 and an adjacent second conductive subportion 232 along the y axis direction. Therefore, before an insert molding, when fiber members 40 extending along the x axis direction are to be placed along the first conductive subportions 231 and the second conductive subportions 232, which themselves are alternately arranged along the x axis direction, there is no structure to stably support the fiber members 40 near each first conductive subportion 231 and each second conductive subportion 232.

In the present embodiment, in order to support the fiber members 40, the lead frame 202 includes an outer frame portion 240 that surrounds a plural sets of conductive members 30, and a plurality of hooks 241 located inside the outer frame portion 240 (see FIGS. 9B and 9C). In the present embodiment, each hook 241 is shaped as a protrusion from the lower face 202b of the lead frame 202, the hook 241 protruding in the z axis direction from the surroundings; specifically, a recess 242 is provided around each hook 241 of the outer frame portion 240. As a result, at the positions of the hooks 241, the lead frame 202 has the same thickness as that of the outer frame portion 240; in the recesses 242, however, the lead frame 202 has a smaller thickness than that of the outer frame portion 240. By engaging the fiber members 40 on the hooks 241, the fiber members 40 can be placed near the first conductive subportions 231 and the second conductive subportions 232. For example, the hooks 241 may be placed inside the outer frame portion 240 in such a manner that plural sets of conductive members 30 that are arranged along the x axis direction are interposed therebetween.

Except for the placement of the fiber members 40, the resin-attached lead frame 152 can be produced in a manner similar to the resin-attached lead frame 151 according to the first embodiment.

Figure 10:
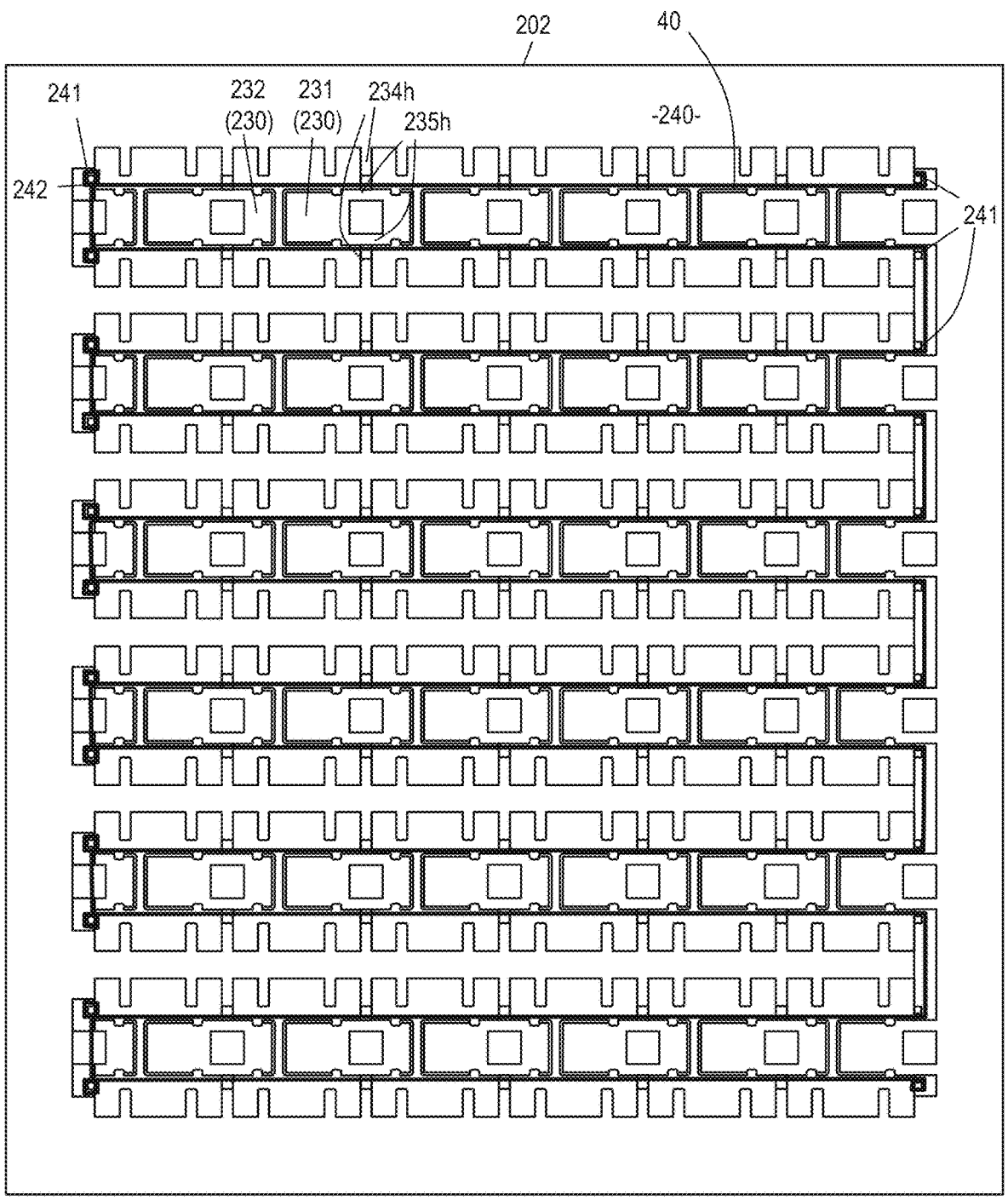
FIG. 10 is a lower plan view showing a plurality of fiber members being placed on a lead frame which is used for manufacturing the second light emitting device.

First, the lead frame 202, having the hooks 241 as shown in FIG. 9A and FIG. 9B provided therein, is produced. Thereafter, as shown in FIG. 10, the fiber members 40 are engaged on the hooks 241 of the lead frame 202. In order to prevent loosening of the fiber members 40 engaged on the hooks 241, before engagement of the fiber members 40 onto the hooks 241, the fiber members 40 may be impregnated with an uncured resin material, and after the fiber members 40 are engaged on the hooks 241, preliminary curing of the resin material may be effected. This suppresses flexure of the fiber members 40, thereby allowing the fiber members 40 to be stably placed relative to the lead frame 202. Thereafter, the lead frame 202 having the fiber members 40 attached thereto may be sandwiched between upper and lower dies, and subjected to an insert molding where resin is injected for integration, whereby the resin-attached lead frame 152 can be obtained.

Although the present embodiment illustrates the hooks 241 as protrusions in the z axis direction, the lead frame 202 may include any other type of hooks. For example, the hooks may be protrusions, bumps, etc., extending in the y axis direction; the fiber members 40 can also be engaged on these.

Third Embodiment

A third embodiment of a light emitting device according to the present disclosure will be described. The light emitting device according to the third embodiment is identical to the light emitting device according to the first embodiment, except mainly for a base body having a different structure. Therefore, the structure of the base body will be mainly described.

Figure 11A:
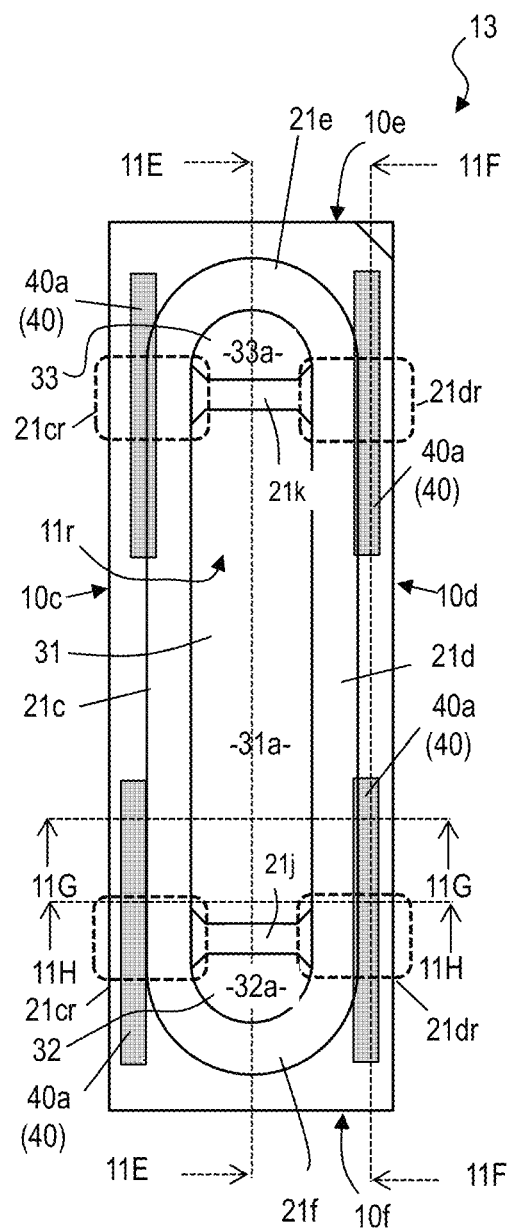
FIG. 11A is a plan view of a base body used in a light emitting device according to a third embodiment.
Figure 11B:
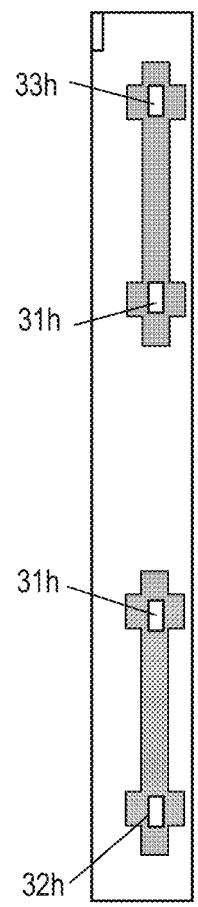
FIG. 11B is a side view of the base body used in a light emitting device according to a third embodiment.
Figure 11C:
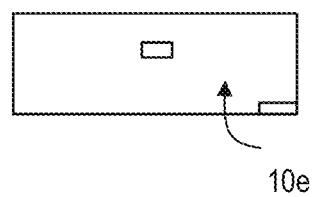
FIG. 11C is a rear view of the base body used in a light emitting device according to a third embodiment.
Figure 11D:
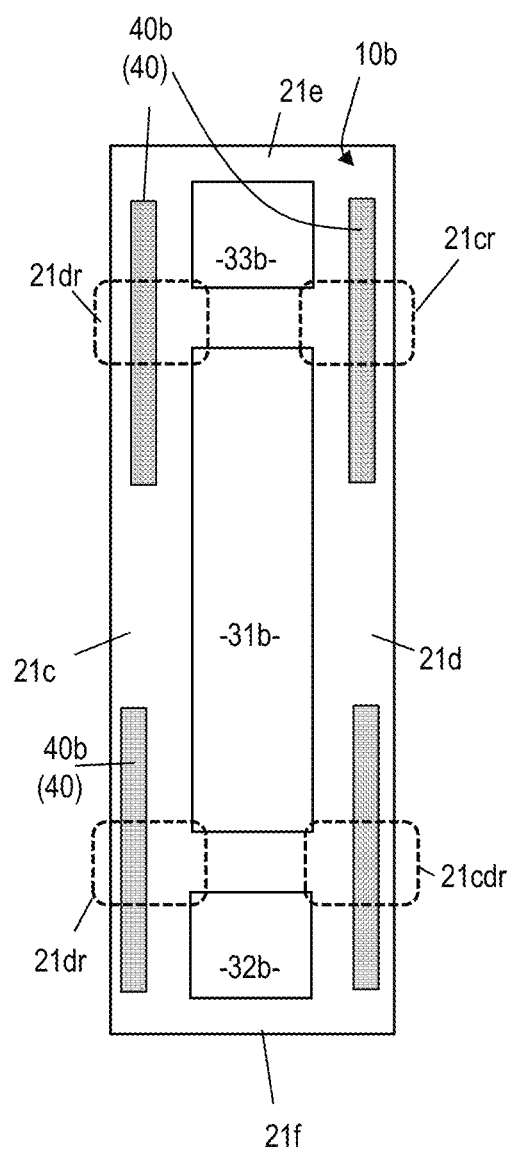
FIG. 11D is a bottom view of the base body used in a light emitting device according to a third embodiment.
Figure 11E:
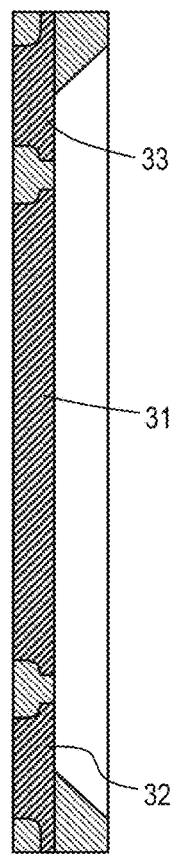
FIG. 11E is a cross-sectional view of the base body taken at line 11E-11E in FIG. 11A.
Figure 11F:
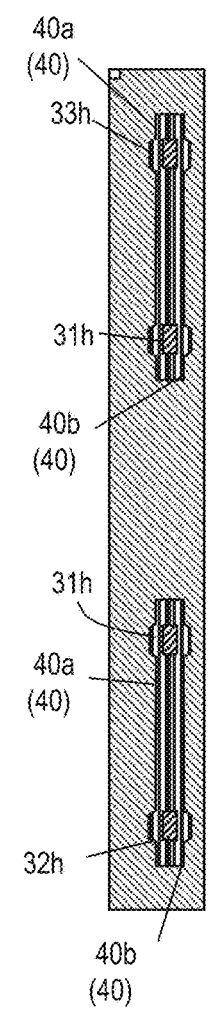
FIG. 11F is a cross-sectional view of the base body taken at line 11F-11F in FIG. 11A.
Figure 11G:
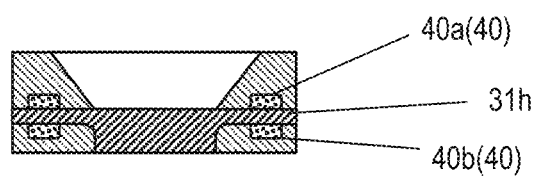
FIG. 11G is a cross-sectional view of the base body taken at line 11G-11G in FIG. 11A.
Figure 11H:
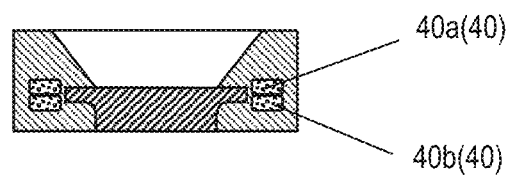
FIG. 11H is a cross-sectional view of the base body taken at line 11H-11H in FIG. 11A.

FIGS. 11A, 11B, 11C, and 11D are a plan view, a side view, a rear view, and a bottom view, respectively, of a base body 13 used in the light emitting device according to the third embodiment; and FIGS. 11E, 11F, 11G, and 11H are cross-sectional views of the base body 13 taken at line 11E-11E, line 11F-11F, line 11G-11G, and line 11H-11H respectively, in FIG. 11A.

In addition to a first conductive member 31 and a second conductive member 32, the base body 13 includes a third conductive member 33. A part of an upper face 33a of the third conductive member 33 is exposed at the bottom face in a recess 11r, whereas a part of a lower face 33b is exposed at a lower face 10b of the base body 13. In addition to an isolation section 21j, a resin body 20 includes an isolation section 21$k$, such that a sandwiching portions 21$c$ and 21$d$ sandwich the isolation sections 21$j$ and 21$k$. Therefore, the sandwiching portion 21$c$ includes two adjoining regions 21$cr$ respectively adjoining the isolation sections 21$j$ and 21$k$. Similarly, the sandwiching portion 21$d$ includes two adjoining regions 21$dr$ respectively adjoining the isolation sections 21$j$ and 21$k$. Fiber members 40 are placed inside the respective adjoining regions 21$cr$ and 21$dr$, and extend in a direction which is non-orthogonal to the direction that the sandwiching portion 21$c$ or 21$d$ extends.

Inside the adjoining region 21$cr$ or 21$dr$ adjoining the isolation section 21$j$, each fiber member 40 includes a second fiber portion 40$b$ which is located beneath the extending portions 31$h$ and 32$h$ and a first fiber portion 40$a$ which is located on the extending portions 31$h$ and 32$h$. Between the extending portions 31$h$ and 32$h$, the second fiber portion 40$b$ and the first fiber portion 40$a$ come in contact with each other. Similarly, inside the adjoining region 21$cr$ or 21$dr$ adjoining the isolation section 21$k$, each fiber member 40 includes a second fiber portion 40$b$ which is located beneath the extending portions 31$h$ and 33$h$ and a first fiber portion 40$a$ which is located on the extending portions 31$h$ and 33$h$. Between the extending portions 31$h$ and 33$h$, the second fiber portion 40$b$ and the first fiber portion 40$a$ come in contact with each other.

The two fiber members 40 located inside the adjoining regions 21$cr$ and 21$dr$ adjoining the isolation section 21$j$ are separated from the two fiber members 40 located inside the adjoining regions 21$cr$ and 21$dr$ adjoining the isolation section 21$k$. Moreover, the end faces of the fiber members 40 are not exposed at an outer lateral face 10$e$ and an outer lateral face 10$f$; rather, the end faces of the fiber members 40 are located inside the resin body 20.

The base body 13 includes three conductive members. Therefore, the light emitting device according to the third embodiment can be used as a 3-terminal device, and may be implemented as, for example, a light emitting device having two light-emitting elements.

Moreover, as in the first and second embodiments, the fiber members 40 are located inside the adjoining regions 21$cr$ and 21$dr$ of the sandwiching portions 21$c$ and 21$d$, and extend along the direction that the sandwiching portion 21$c$ or 21$d$ extends. This enhances the strength of the base body 13. Furthermore, each fiber member 40 includes two fiber portions which are disposed so as to sandwich two extending portions from above and below, and yet come in contact with each other in between the extending portions. Thus, fiber members 40 can be fixedly placed onto the extending portions. This allows the fiber members 40 to be arranged only in places where the strength of the base body 13 is likely to deteriorate, thereby reducing the amount of fiber members 40 used. Moreover, an implementation is possible such that the fiber members 40 are not exposed at the outer lateral faces. Therefore, no interfaces between the fiber members 40 and the resin body 20 are created at the outer lateral faces, whereby the hermeticity and environmental resistance of the base body 13 can be enhanced.

Figure 12A:
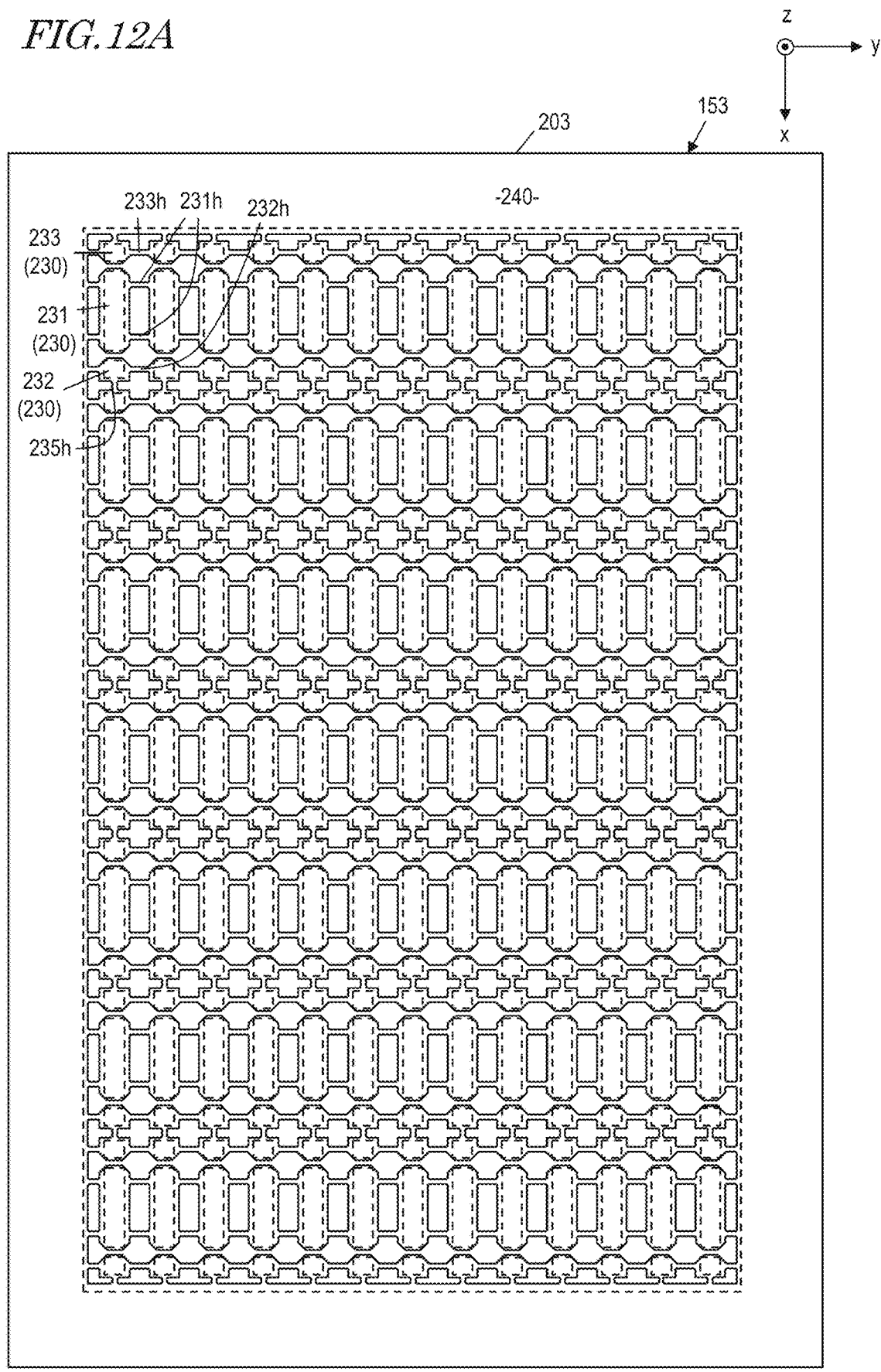
FIG. 12A is an upper plan view of a lead frame which is used for manufacturing a third light emitting device.
Figure 12B:
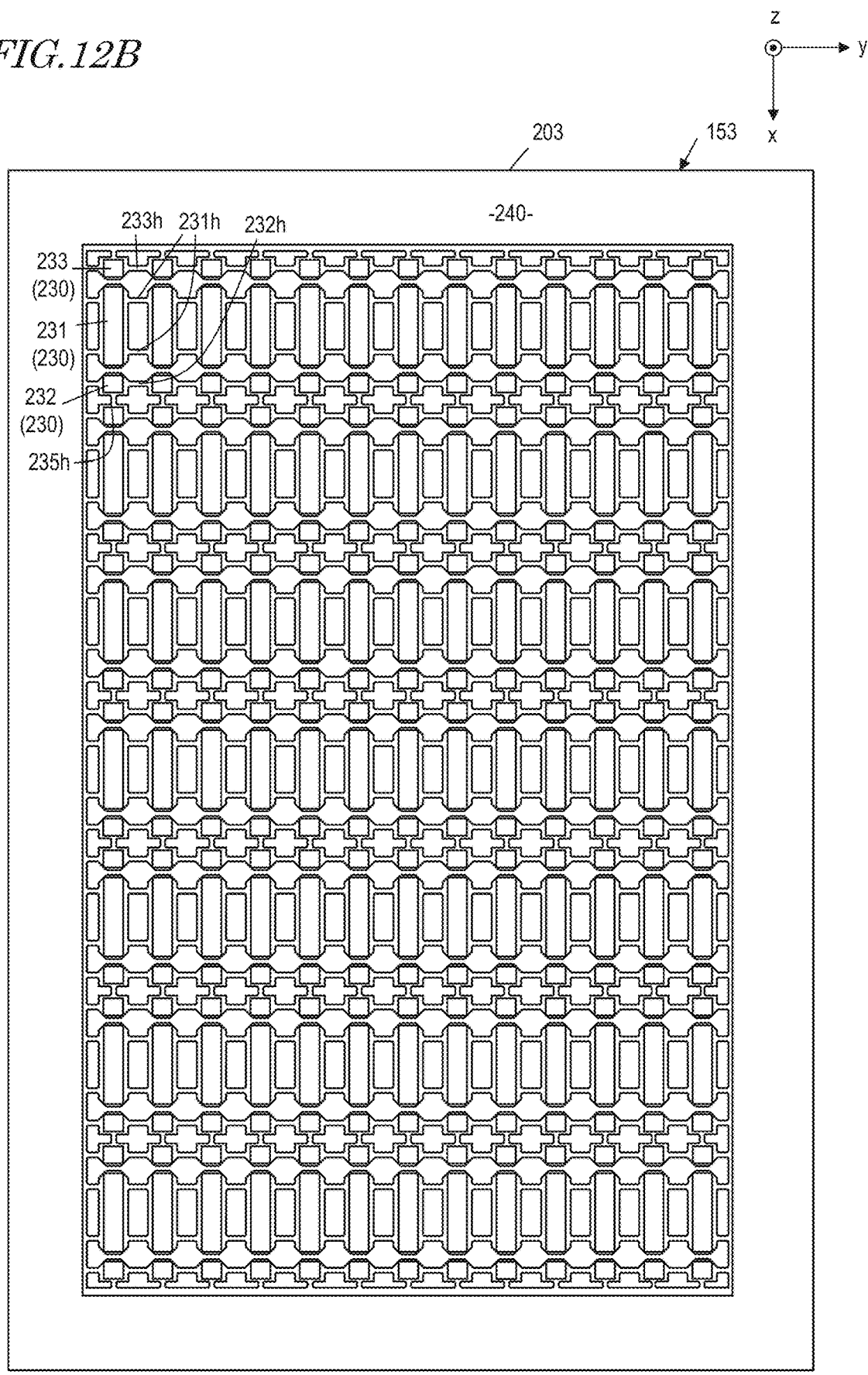
FIG. 12B is a lower plan view of a lead frame which is used for manufacturing the third light emitting device.

A resin-attached lead frame 152 in which such base bodies 13 are integrated can be produced by placing fiber members 40 having the aforementioned characteristic aspects on a lead frame. Hereinafter, a resin-attached lead frame according to the present embodiment will be described mainly with respect to the placement of the lead frame and the fiber members. FIG. 12A and FIG. 12B are an upper plan view and a lower plan view, respectively, of a lead frame 203 which is used for the resin-attached lead frame according to the present embodiment.

In the lead frame 203, the conductive portions 230, which are arranged along the x axis direction, include: first conductive subportions 231 to become the first conductive members 31; second conductive subportions 232 to become the second conductive members 32; and third conductive subportions 233 to become the third conductive members 33. Every second conductive subportion 232 and every third conductive subportion 233 are arranged so that a first conductive subportion 231 is interposed therebetween. Each second conductive subportion 232 is connected to the third conductive subportion 233 of an adjacent conductive portion 230 along the x axis direction, via a connecting portion (first connecting portion) 235$h$. Each first conductive subportion 231, each second conductive subportion 232, and each third conductive subportion 233 are connected to the first conductive subportion 231, the second conductive subportion 232, and the third conductive subportion 233 of an adjacent conductive portion 230 along the y axis direction, respectively, via connecting portions (second connecting portions) 231$h$, 232$h$, and 233$h$. The connecting portion 231$hs$, 232$h$, and 233$h$ correspond to the extending portions 31$h$, 32$h$, and 33$h$, respectively.

Figure 13A:
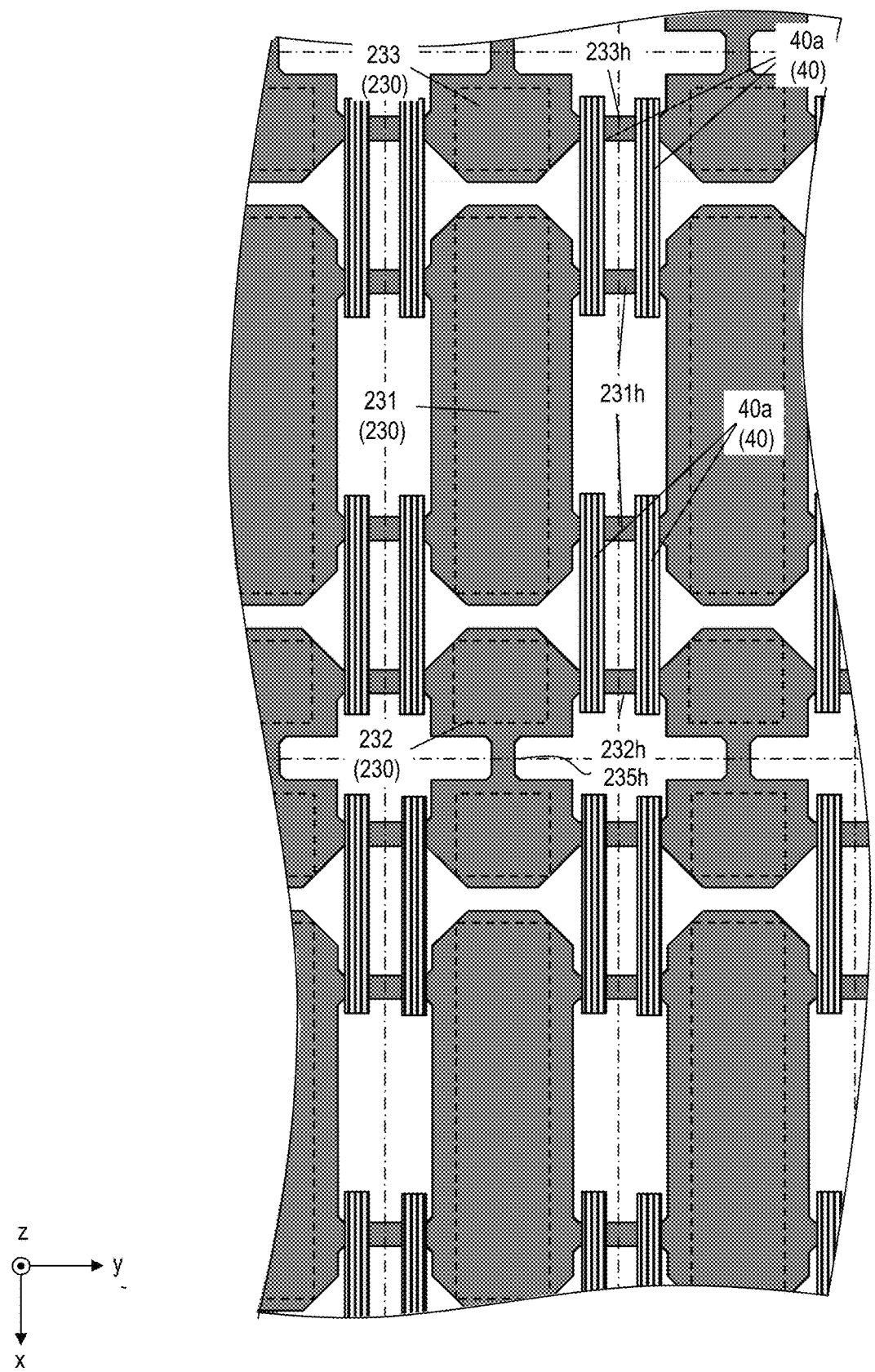
FIG. 13A is an upper plan view showing enlarged a plurality of fiber members being placed on a lead frame which is used for manufacturing the third light emitting device.
Figure 13B:
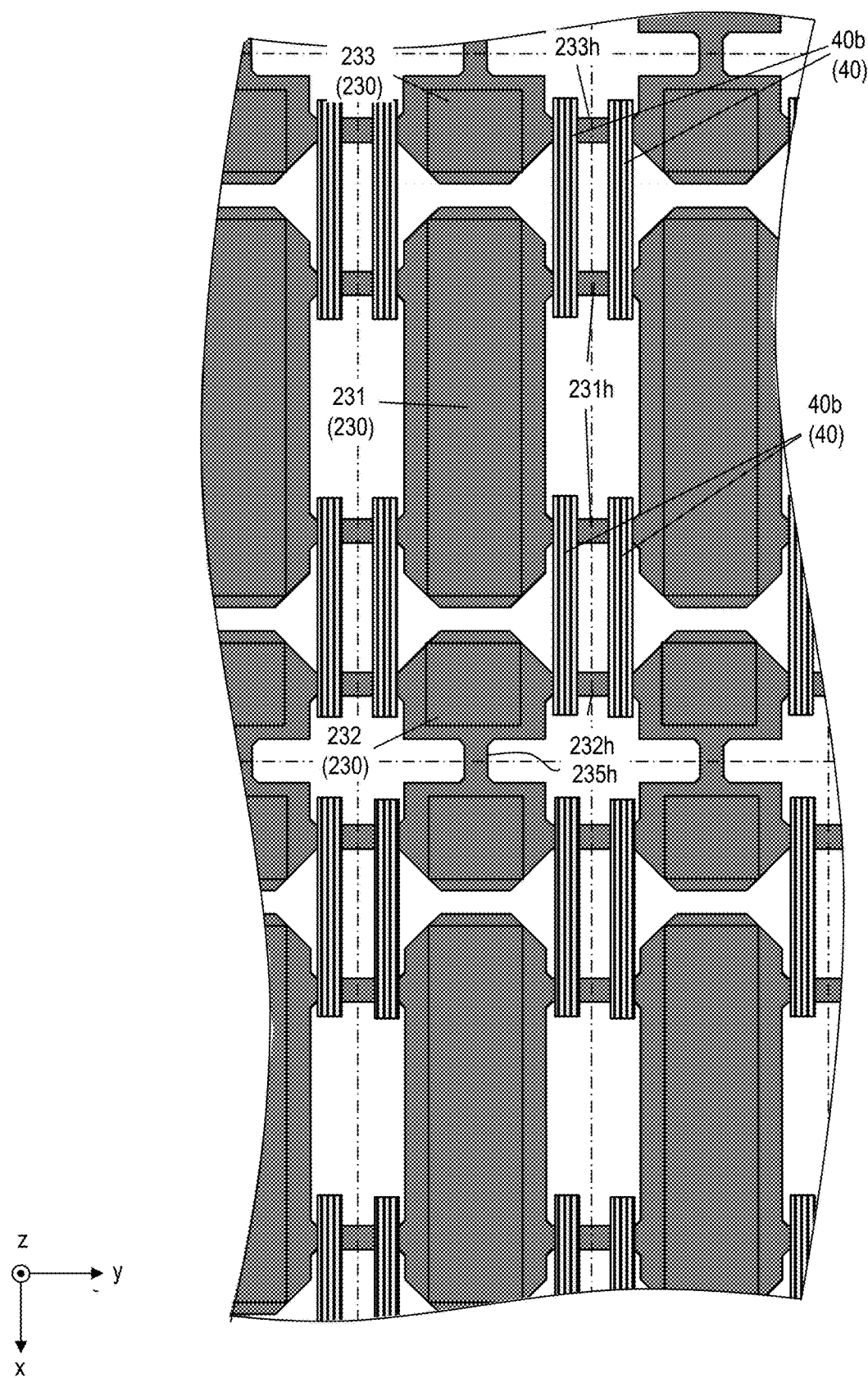
FIG. 13B is a lower plan view showing enlarged a plurality of fiber members being placed on a lead frame which is used for manufacturing the third light emitting device.

FIG. 13A and FIG. 13B are, respectively, an upper plan view and a lower plan view showing enlarged some fiber members 40 being placed on the lead frame 203. The first fiber portions 40$a$ of the fiber members 40 are located astride the connecting portions 231$h$ and the connecting portions 232$h$ from above, whereas the second fiber portions 40$b$ of the fiber members 40 are located astride the connecting portions 231$h$ and the connecting portions 232$h$ from below. Each first fiber portion 40$a$ is adhesively bonded to the corresponding second fiber portion 40$b$, in between the connecting portion 231$h$ and the connecting portion 232$h$. On the other hand, the first fiber portions 40$a$ of the fiber members 40 are located astride the connecting portions 231$h$ and the connecting portions 233$h$ from above, whereas the second fiber portions 40$b$ of the fiber members 40 are located astride the connecting portions 231$h$ and the connecting portions 233$h$ from below. Each first fiber portion 40$a$ is adhesively bonded to the corresponding second fiber portion 40$b$, in between the connecting portion 231$h$ and the connecting portion 233$h$.

FIG. 13A and FIG. 13B indicate with dot-dash lines the cut lines to be used when the resin-attached lead frame is singulated into separate base bodies 13. Although the first fiber portions 40$a$ and the second fiber portions 40$b$ are placed between a plurality of dot-dash lines extending along the x axis direction and the y axis direction, the first fiber portions 40$a$ and the second fiber portions 40$b$ never intersect the cut lines. Such placement prevents cross sections of the fiber members 40 from becoming exposed at the outer lateral faces when the resin-attached lead frame is singulated. Because the fiber members 40 do not need to be cut during singulation, cutting is also made easier.

The aforementioned arrangement of fiber members 40 can be obtained by using, for example, so-called pre-pregs, i.e., fiber members impregnated with resin and semi-cured, or fiber members impregnated with uncured resin.

For example, semi-cured first fiber portions 40$a$ and second fiber portions 40$b$ may be placed above and below the connecting portions 231$h$ and the connecting portions 232$h$, and above and below the connecting portions 231$h$ and the connecting portions 233$h$. While keeping each first fiber portion 40$a$ and the corresponding second fiber portions 40$b$ in contact with each other in between the connecting portions, they may be subjected to heating, thereby curing and joining them. Thereafter, the lead frame 203 having the fiber members 40 placed thereon may be sandwiched between dies, and subjected to an insert molding and resin curing as has been described in the first embodiment, whereby the resin-attached lead frame 153 can be produced.

Fourth Embodiment

A fourth embodiment of a light emitting device according to the present disclosure will be described. The light emitting device according to the fourth embodiment is identical to the light emitting device according to the first embodiment, except mainly for a base body having a different structure. Therefore, the structure of the base body will be mainly described.

Figure 14A:
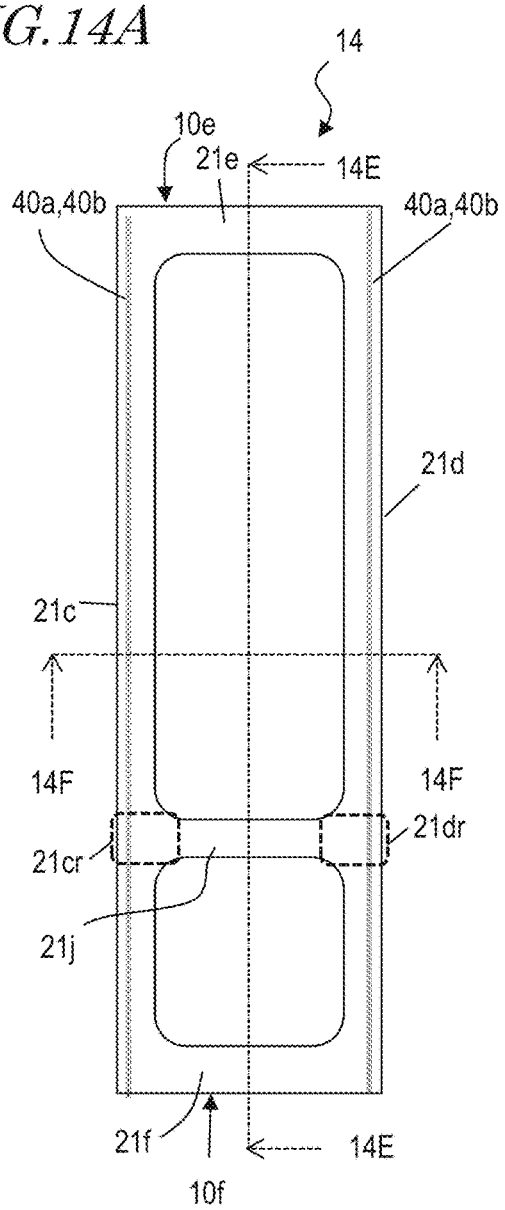
FIG. 14A is a plan view of a base body used in a light emitting device according to a fourth embodiment.
Figure 14B:
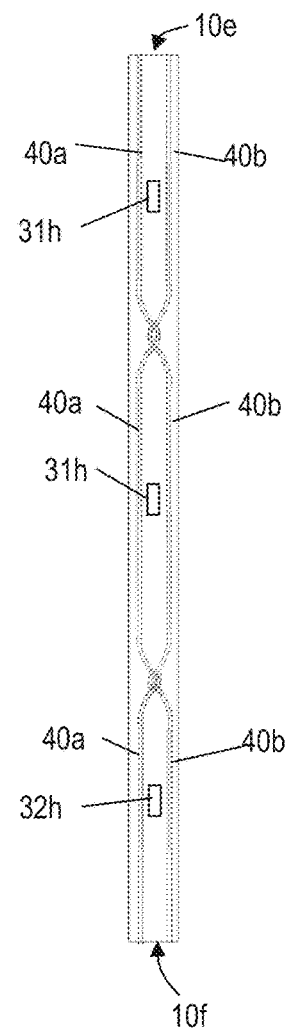
FIG. 14B is a side view of the base body used in a light emitting device according to the fourth embodiment.
Figure 14C:
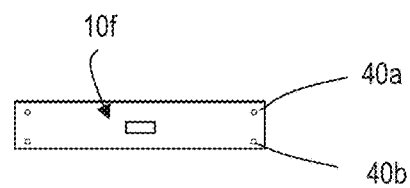
FIG. 14C is a front view of the base body used in a light emitting device according to the fourth embodiment.
Figure 14D:
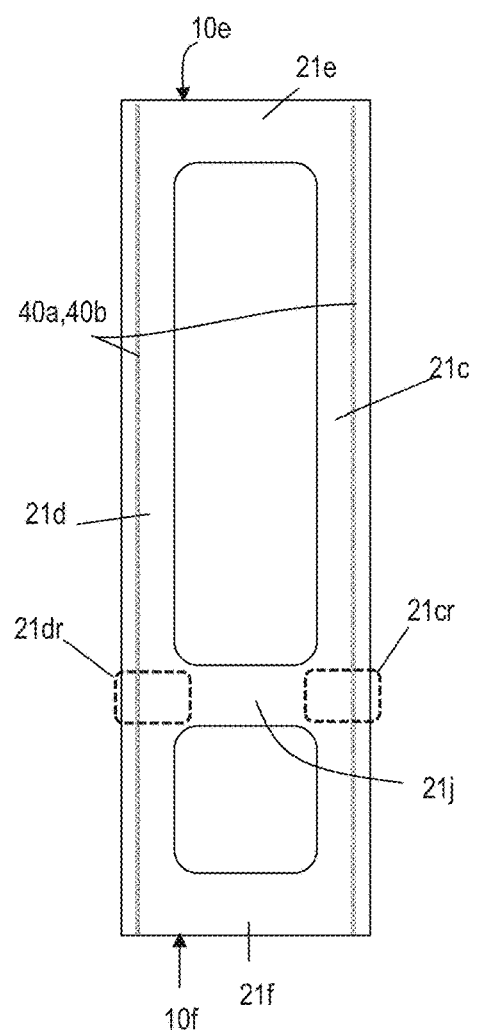
FIG. 14D is a bottom view of the base body used in a light emitting device according to the fourth embodiment.
Figure 14E:
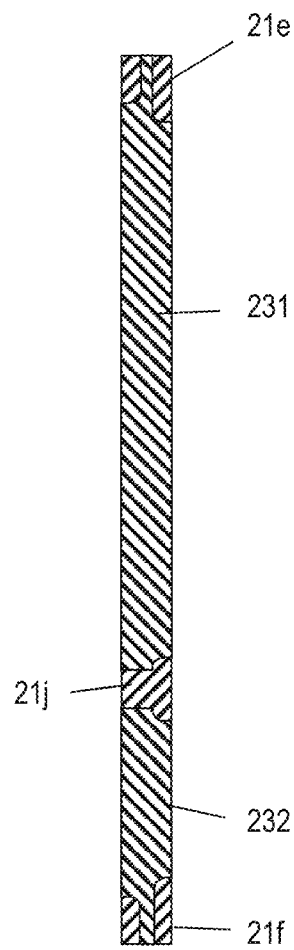
FIG. 14E is a cross-sectional view of the base body taken at line 14E-14E in FIG. 14A.
Figure 14F:
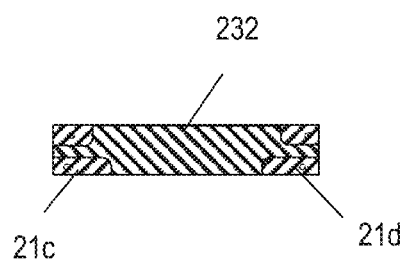
FIG. 14F is a cross-sectional view of the base body taken at line 14F-14F in FIG. 14A.

FIGS. 14A, 14B, 14C, and 14D are a plan view, a side view, a front view, and a bottom view, respectively, of a base body 14 used in the light emitting device according to the fourth embodiment; and FIGS. 14E and 14F are cross-sectional views of the base body 14 taken at line 14E-14E and line 14F-14F, respectively, in FIG. 14A.

As in the first embodiment, a resin body 20 of the base body 14 includes sandwiching portions 21c and 21d, interconnecting portions 21e and 21f, and an isolation section 21j. Fiber members 40 are only placed in the sandwiching portions 21c and 21d. Each fiber member 40 includes a first fiber portion 40a and a second fiber portion 40b. The first fiber portion 40a is placed above two extending portions 31h and an extending portion 32h, whereas the second fiber portion 40b is placed below the two extending portions 31h and the extending portion 32h. In between the two extending portions 31h and between the extending portions 31h and 32h, the first fiber portion 40a and the second fiber portion 40b are engaged with each other. More specifically, in between the two extending portions 31h and between the extending portions 31h and 32h, the first fiber portion 40a is located below the second fiber portion 40b, and the second fiber portion 40b is located above the first fiber portion 40a, such that the first fiber portion 40a and the second fiber portion 40b intertwine each other.

Since the base body 14 includes the fiber members 40, the strength of the base body 14 is enhanced, as in the first embodiment. Moreover, since the first fiber portion 40a and the second fiber portion 40b intertwine each other, the first fiber portion 40a and the second fiber portion 40b are less likely to become detached from the resin body 20, even if the end faces of the first fiber portion 40a and the second fiber portion 40b may be exposed at an outer lateral face 10e and an outer lateral face 10f.

The aforementioned placement of the fiber members 40 can be achieved by for example, using a sewing machine in order to place the first fiber portions 40a and the second fiber portions 40b on the lead frame 204. FIG. 15A is an upper plan view of the fiber members 40 being placed on the lead frame 204 for obtaining a resin-attached lead frame in which the base bodies 14 are integrated; and FIG. 15B is a cross-sectional view of the lead frame 204 taken at line 15B-15B in FIG. 15A. In the lead frame 204, each first conductive subportion 231 (corresponding to the first conductive member 31) is connected to the first conductive subportion 231 of an adjacent conductive portion 230 along the y axis direction by two connecting portions 231h (corresponding to the extending portions 31h). Moreover, each second conductive subportion 232 (corresponding to the second conductive member 32) is connected to the second conductive subportion 232 of an adjacent conductive portion 230 along they axis direction by a connecting portion 232h (corresponding to the extending portion 32h).

The first fiber portions 40a and the second fiber portions 40b are placed on both sides of each column of plural sets of conductive members 30 arranged along the x axis direction. Each first fiber portion 40a is placed above two connecting portions 231h and a connecting portion 232h, whereas each second fiber portion 40b is placed below the two connecting portions 231h and the connecting portion 232h. Between the two connecting portions 231h and between the connecting portions 231h and 232h, the first fiber portion 40a is located below the second fiber portion 40b, and the second fiber portion 40b is located above the first fiber portion 40a, such that the first fiber portion 40a and the second fiber portion 40b intertwine each other.

The aforementioned placement of the first fiber portions 40a and the second fiber portions 40b can be achieved by, while utilizing the first fiber portions 40a and the second fiber portions 40b respectively as an upper thread and a lower thread, for example, using a sewing machine for industrial use to yield the first fiber portions 40a and the second fiber portions 40b in a manner of sewing the two connecting portions 231h and the connecting portions 232h along the x axis direction. By allowing the first fiber portion 40a and the second fiber portion 40b to intersect each other between connecting portions, the fiber members 40 can be stably placed on the lead frame 204. This facilitates handling of the lead frame 204 having the fiber members 40 placed thereon.

Fifth Embodiment

A fifth embodiment of a light emitting device according to the present disclosure will be described. The light emitting device according to the fifth embodiment is identical to the light emitting device according to the first embodiment, except mainly for a base body having a different structure. Therefore, the structure of the base body will be mainly described.

Figure 16A:
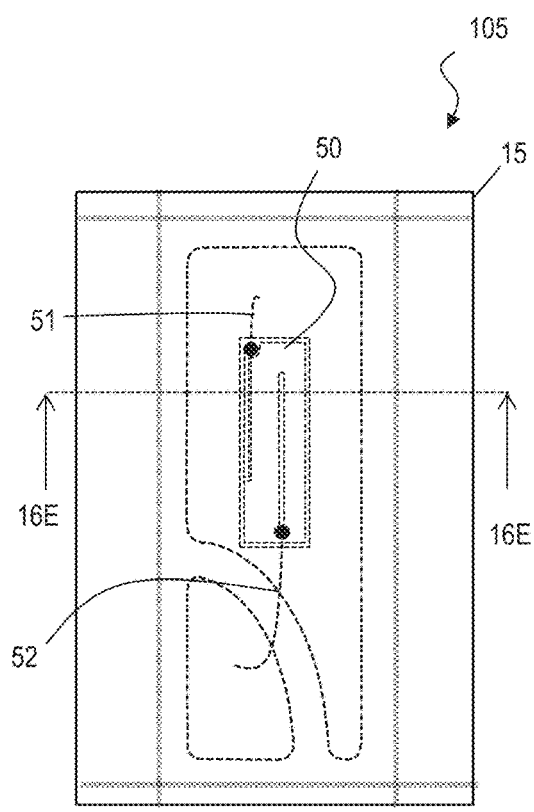
FIG. 16A is a plan view of a light emitting device according to a fifth embodiment.
Figure 16B:
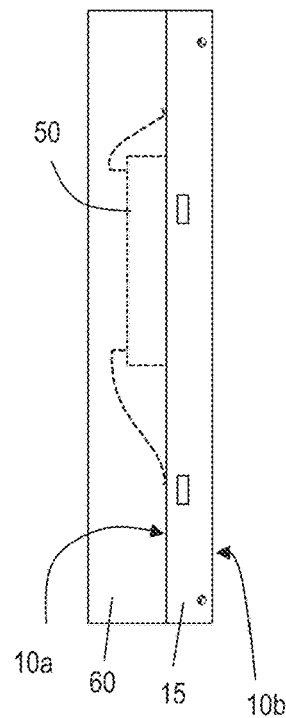
FIG. 16B is a side view of the light emitting device according to the fifth embodiment.
Figure 16C:
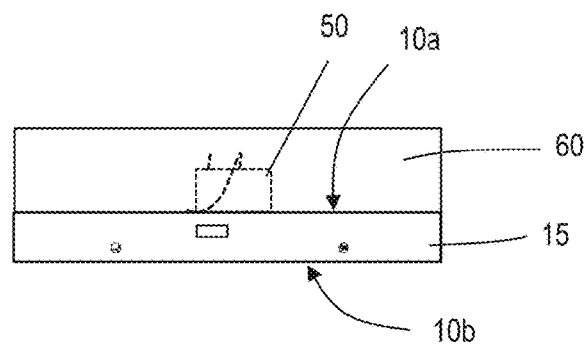
FIG. 16C is a front view of the light emitting device according to the fifth embodiment.
Figure 16D:
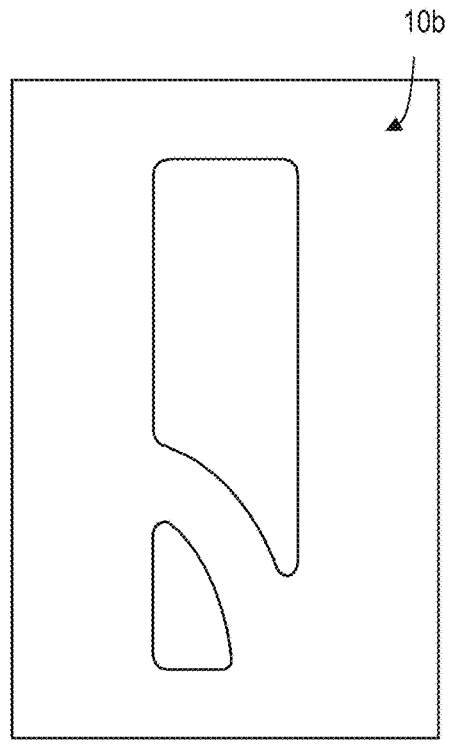
FIG. 16D is a bottom view of the light emitting device according to the fifth embodiment.
Figure 16E:
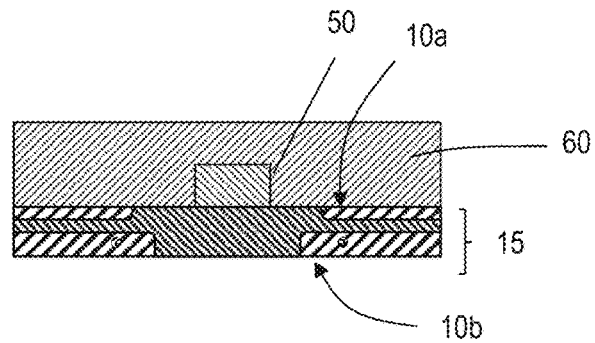
FIG. 16E is a cross-sectional view of the base body taken at line 16E-16E in FIG. 16A.
Figure 17A:
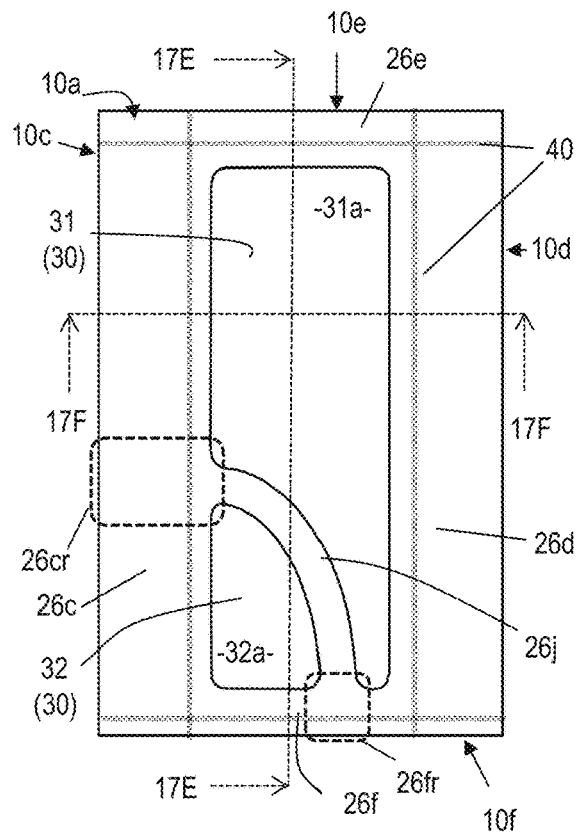
FIG. 17A is a plan view of a base body used in the light emitting device according to the fifth embodiment.
Figure 17B:
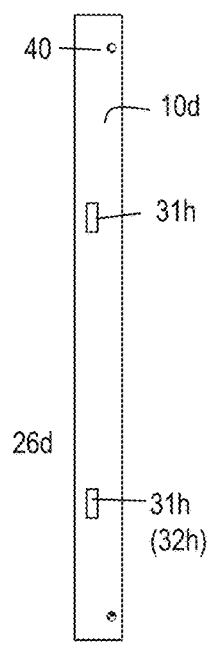
FIG. 17B is a side view of the base body used in the light emitting device according to the fifth embodiment.
Figure 17C:
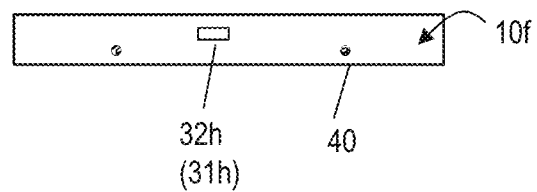
FIG. 17C is a front view of a base body used in the light emitting device according to the fifth embodiment.
Figure 17D:
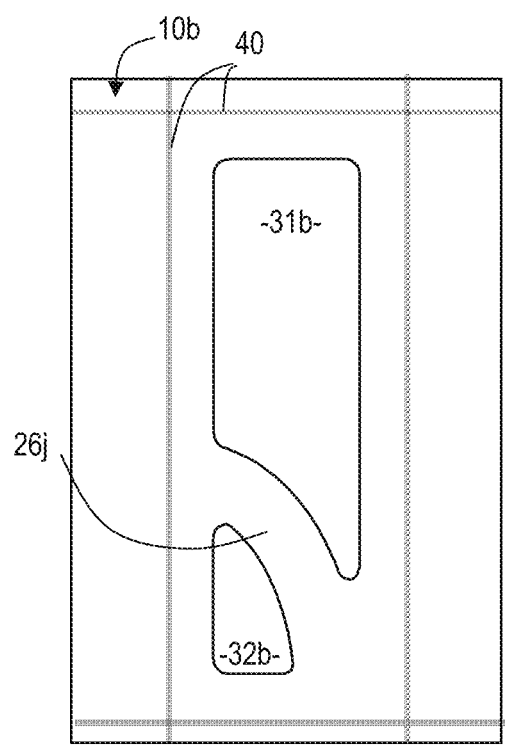
FIG. 17D is a bottom view of a base body used in the light emitting device according to the fifth embodiment.
Figure 17E:
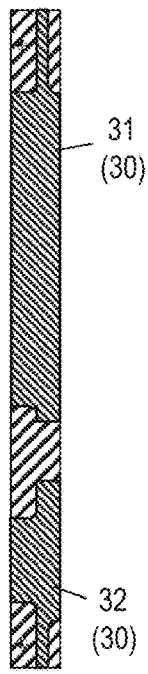
FIG. 17E is a cross-sectional view of the base body taken at line 17E-17E in FIG. 17A.
Figure 17F:
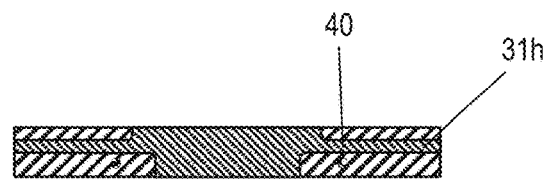
FIG. 17F is a cross-sectional view of the base body taken at line 17F-17F in FIG. 17A.

FIGS. 16A, 16B, 16C, and 16D are a plan view, a side view, a front view, and a bottom view, respectively, of the light emitting device 105 according to the fifth embodiment; and FIG. 16E is a cross-sectional view of the light emitting device 105 taken at line 16E-16E in FIG. 16A. FIGS. 17A, 17B, 17C, and 17D are a plan view, a side view, a front view, and a bottom view, respectively, of a base body 15 used in the light emitting device 105 according to the fifth embodiment; and FIGS. 17E and 17F are cross-sectional views of the base body 15 taken at line 17E-17E and line 17F-17F, respectively, in FIG. 17A.

The base body 15 has no recesses, and its upper face 10a and lower face 10b are flat. As a result, a sealing member 60 is located so as to cover the entire upper face 10a. Moreover, a first conductive member 31 and a second conductive member 32 are different from those of the light emitting device according to the first embodiment. Except for its four round corners, the edge of an upper face 31a of the first conductive member 31 consists of: a long straight line; a short straight line which is perpendicular to the long straight line; a medium-lengthed straight line which is parallel to the long straight line and perpendicular to the short straight line; and an inwardly-convex curve. Except for its three round corners, the edge of an upper face 32a of the second conductive member 32 consists of: a long straight line; a short straight line; and an outwardly-convex curve. The shape of a resin body 20 is rectangular in top view. Therefore, an isolation section 26j located between the first conductive member 31 and the second conductive member 32 has a curve shape, and is located, in top view, so as to extend between two adjacent sides among the four sides of the rectangle. The resin body 20 includes sandwiching portions 26c and 26f and interconnecting portions 26e and 26d. Even though the sandwiching portions 26c and 26f sandwich the isolation section 26j, the sandwiching portion 26c and the sandwiching portion 26f are located on two adjacent sides of the rectangle. The direction that the sandwiching portion 26c extends and the direction that the sandwiching portion 26f extends are orthogonal to each other; and since the sandwiching portions 26c and 26f are connected to each other at one end, the sandwiching portions 26c and 26f together present an "L" shape. Moreover, the interconnecting portion 26e and the interconnecting portion 26d are located on two adjacent sides of the rectangle. The direction that the interconnecting portion 26e extends and the direction that the interconnecting portion 26d extends are orthogonal to each other; and since the interconnecting portions 26e and 26d are connected at one end to each other, the interconnecting portions 26e and 26d together present an "L" shape. As the two "L" shapes are connected to each other at both ends, they together present the rectangular shape.

The sandwiching portions 26c and 26f have adjoining regions 26cr and 26fr, respectively, each adjoining the isolation section 26j.

Each fiber member 40 is located inside the adjoining region 26cr or the adjoining region 26fr of at least one of the sandwiching portions 26c and 26f, and, inside the respective adjoining region 26cr or 26fr, extends in a direction which is non-orthogonal to the direction that the sandwiching portion 26c or 26f extends.

In the first conductive member 31, four extending portions 31h are provided, such that an end face of one extending portion 31h is exposed at each of an outer lateral face 10c and an outer lateral face 10e. On the other hand, end faces of two extending portions 31h are exposed at an outer lateral face 10d. The second conductive member 32 includes two extending portions 32h, such that an end face of one extending portion 32h is exposed at each of the outer lateral face 10c and an outer lateral face 10f.

In the present embodiment, fiber members 40 are located inside both of the adjoining regions 26cr and 26fr of the sandwiching portions 26c and 26f. More specifically, the base body 15 includes four fiber members 40, which are respectively embedded inside the sandwiching portions 26c and 26f and the interconnecting portions 26e and 26d, along the respective directions that the sandwiching portions 26c and 26f and the interconnecting portions 26e and 26d extend. Since the fiber members 40 are embedded along the directions that the sandwiching portions 26c and 26f extend, as in the first embodiment, the strength of the base body 15 is enhanced in the adjoining regions 26cr and 26fr of the sandwiching portions 26c and 26f being connected to the isolation section 26j, where stress is likely to concentrate.

A resin-attached lead frame in which the base bodies 15 are integrated can be produced in a similar manner to the first embodiment. By using the resin-attached lead frame having been produced, a light emitting device 105 can be produced in a similar manner to the first embodiment. Unlike in the first embodiment, though, the latticework portion of the resin-attached lead frame 155 has no recesses.

Figure 18:
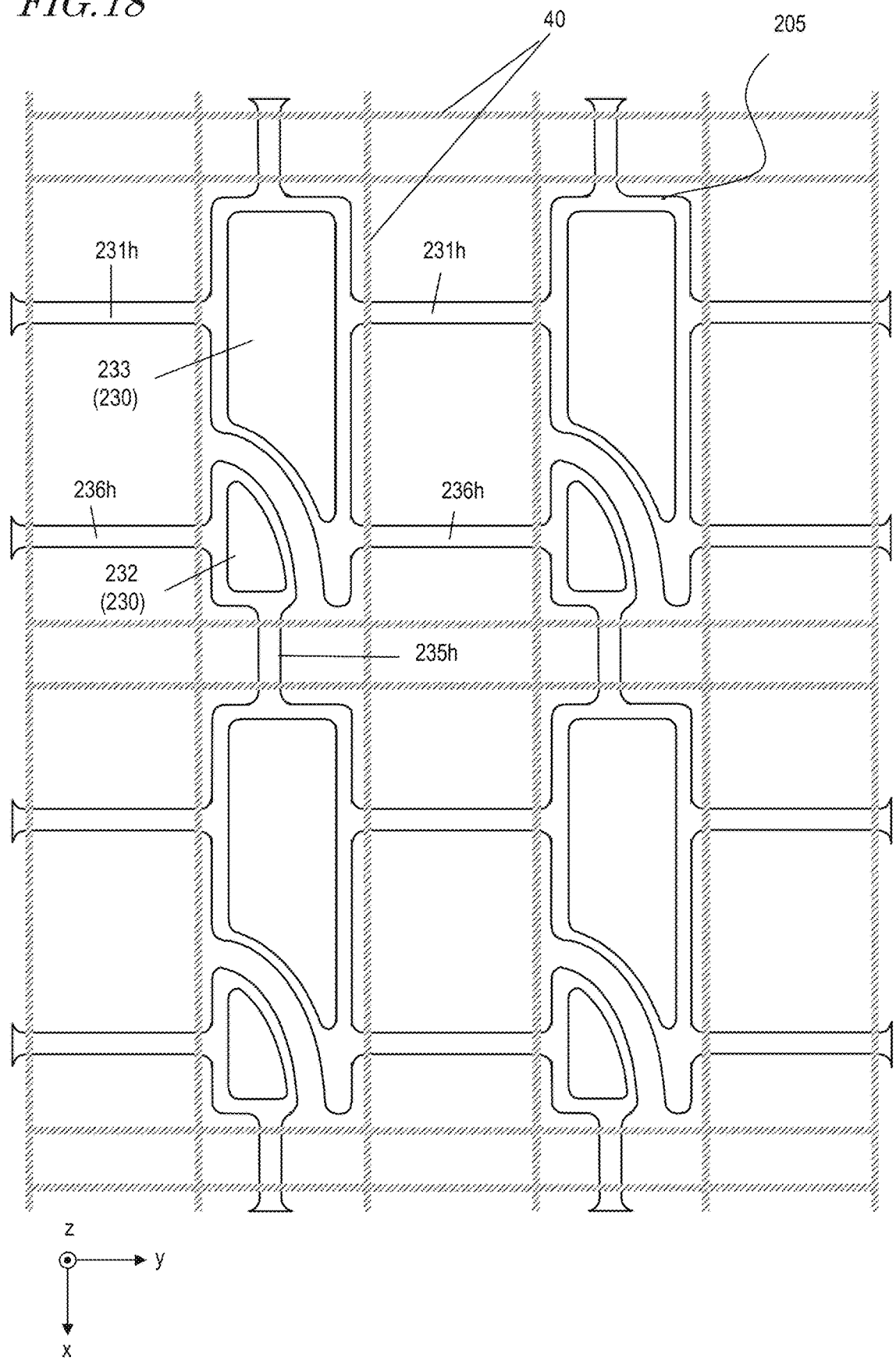
FIG. 18 is a plan view showing enlarged the placement of a plurality of fiber members and a lead frame which is used for manufacturing a light emitting device according to the fifth embodiment.

FIG. 18 shows enlarged the placement of the lead frame 205 and the fiber members 40 in the resin-attached lead frame in which the base bodies 15 are integrated. In the lead frame 205, conductive portions 230 are arranged in a two-dimensional array along the x axis direction and the y axis direction. Each first conductive subportion 231 and each second conductive subportion 232 are connected via a connecting portion 235h extending along the x axis direction. Sets of the first conductive subportion 231 and the second conductive subportion 232 being connected to each other are arranged along the x axis direction, via gaps in which the isolation sections 26j are placed.

Each first conductive subportion 231 is connected to an adjacent first conductive subportion 231 on the right side along the y axis direction by a connecting portion 231h, and connected to an adjacent second conductive subportion 232 on the right side along the y axis direction by a connecting portion 236h.

The fiber members 40 are placed so as to fit around the respective conductive portions 230. Specifically, two fiber members 40 extending along the x axis direction are placed so that a column of conductive portions 230 arranged along the x axis direction is interposed therebetween. Moreover, two fiber members 40 extending along the y axis direction are placed so that a row of conductive portions 230 arranged along the y axis direction is interposed therebetween. Each of such fiber members 40 may be an independent monofilament or a bundle of fibers, or they may together constitute a knotless net.

Using the resin-attached lead frame 155, a light emitting device 105 can be produced by a method similar to the method which was described in the first embodiment.

A light emitting device according to the present disclosure can be suitably used for various light sources, e.g., light sources for illumination purposes, light sources for various indicators, light sources for displays, light sources in the backlights of liquid crystal displays, traffic lights, onboard parts for vehicles, channel letters for signage use, and so on.

While exemplary embodiments of the present invention have been described above, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A light emitting device comprising:
   a base body including two conductive members each having an upper face and a lower face, a resin body covering a part of each conductive member, and a fiber member placed inside the resin body, a part of the upper face of each conductive member being exposed from the resin body at an upper side of the base body, and a part of the lower face of each conductive member being exposed from the resin body at a lower side of the base body; and
   a light-emitting element electrically connected to the two conductive members, wherein,
   the resin body includes an isolation section located between the two conductive members, and includes a pair of sandwiching portions sandwiching the isolation section;
   the fiber member has a length which is greater than a distance between the two conductive members, and is located at least in an adjoining region of at least one of the pair of sandwiching portions, the adjoining region adjoining the isolation section; and,
   in the adjoining region, the fiber member extends in a direction which is non-orthogonal to a direction in which the pair of sandwiching portions extend,
   wherein, each sandwiching portion has an outer lateral face;

the two conductive members each include an extending portion, the extending portion extending toward the outer lateral face of one of the pair of sandwiching portions and having an end face which is exposed at said outer lateral face; and the fiber member includes a first fiber portion located downward of the extending portion.

2. The light emitting device of claim 1, wherein the fiber member further includes a second fiber portion located upward of the extending portion.

3. The light emitting device of claim 2, wherein the first fiber portion and the second fiber portion come in contact with each other in between the extending portions of the two conductive members.

4. The light emitting device of claim 1, wherein, the resin body includes a pair of interconnecting portions interconnecting the sandwiching portions; and each of the pair of interconnecting portions has an outer lateral face, an end face of the fiber member being exposed at the outer lateral face of one of the pair of interconnecting portions.

5. The light emitting device of claim 1, wherein an end face of the fiber member is located inside the resin body.

6. The light emitting device of claim 2, wherein, the resin body includes a pair of interconnecting portions interconnecting the sandwiching portions; and each of the pair of interconnecting portions has an outer lateral face, an end face of the fiber member being exposed at the outer lateral face of one of the pair of interconnecting portions.

7. The light emitting device of claim 2, wherein an end face of the fiber member is located inside the resin body.

8. The light emitting device of claim 3, wherein, the resin body includes a pair of interconnecting portions interconnecting the sandwiching portions; and each of the pair of interconnecting portions has an outer lateral face, an end face of the fiber member being exposed at the outer lateral face of one of the pair of interconnecting portions.

9. The light emitting device of claim 3, wherein an end face of the fiber member is located inside the resin body.

10. A resin-attached lead frame, comprising:
a lead frame;
a resin member;
a plurality of fiber members; and
a plurality of additional fiber members,
wherein the lead frame includes:
  a plurality of conductive portions arrayed along a first direction and a second direction which intersects the first direction, each conductive portion having an upper face and a lower face in relation to a third direction which is perpendicular to the first direction and the second direction, and each conductive portion including first and second conductive subportions in a plane containing the first direction and the second direction, the first and second conductive subportions being arranged along the first direction and spaced apart from each other by a gap; and
  a plurality of connecting portions connecting between the plurality of conductive portions along the first direction and along the second direction,
wherein the resin member includes:
  a plurality of isolation portions each placed in the gap between the first and second conductive subportions; and
  a latticework portion placed between the plurality of conductive portions so as to surround each conductive portion while leaving a part of the upper face and a part of the lower face of the conductive portion exposed, the latticework portion including a plurality of first portions extending along the first direction and a plurality of second portions extending along the second direction,
wherein the plurality of fiber members each has a length which is greater than a distance between the first and second conductive subportions,
wherein, in the resin member, one end of each isolation portion is connected to a corresponding one of the plurality of first portions,
wherein one of the plurality of fiber members is located at least in an adjoining region of the first portion to which each isolation portion is connected, the adjoining region adjoining the isolation portion, the one of the plurality of fiber members extending within the adjoining region in a direction which is non-orthogonal to the first direction, and
wherein,
  the latticework portion of the resin member includes a plurality of second portions extending along the second direction;
  the plurality of additional fiber members are embedded in the plurality of second portions; and
  the fiber members and the plurality of additional fiber members constitute a knotless net.

11. The resin-attached lead frame of claim 10, wherein, the lead frame includes an outer frame portion surrounding the plurality of conductive portions arrayed along the first and second directions, and a plurality of hooks located inside the outer frame portion; and
  the plurality of fiber members are engaged on and supported by the plurality of hooks.

12. The resin-attached lead frame of claim 10, wherein the plurality of fiber members are impregnated with a resin, and the resin has been cured.

13. The resin-attached lead frame of claim 11, wherein the plurality of fiber members are impregnated with a resin, and the resin has been cured.

14. A resin-attached lead frame, comprising:
a lead frame;
a resin member; and
a plurality of fiber members,
wherein the lead frame includes:
  a plurality of conductive portions arrayed along a first direction and a second direction which intersects the first direction, each conductive portion having an upper face and a lower face in relation to a third direction which is perpendicular to the first direction and the second direction, and each conductive portion including first and second conductive subportions in a plane containing the first direction and the second direction, the first and second conductive subportions being arranged along the first direction and spaced apart from each other by a gap; and
  a plurality of connecting portions connecting between the plurality of conductive portions along the first direction and along the second direction,
wherein the resin member includes:
  a plurality of isolation portions each placed in the gap between the first and second conductive subportions; and
  a latticework portion placed between the plurality of conductive portions so as to surround each conductive portion while leaving a part of the upper face and a part of the lower face of the conductive portion exposed, the latticework portion including a plurality of first portions extending along the first direction and a plurality of second portions extending along the second direction, wherein the plurality of fiber members each has a length which is greater than a distance between the first and second conductive subportions, wherein, in the resin member, one end of each isolation portion is connected to a corresponding one of the plurality of first portions, wherein one of the plurality of fiber members is located at least in an adjoining region of the first portion to which each isolation portion is connected, the adjoining region adjoining the isolation portion, the one of the plurality of fiber members extending within the adjoining region in a direction which is non-orthogonal to the first direction, wherein, the lead frame includes an outer frame portion surrounding the plurality of conductive portions arrayed along the first and second directions, and a plurality of hooks located inside the outer frame portion; and the plurality of fiber members are engaged on and supported by the plurality of hooks.

15. The resin-attached lead frame of claim 14, wherein, in the resin member, another end of each isolation portion is connected to another one of the plurality of first portions; and another one of the plurality of fiber members is located at least in an adjoining region of the other first portion to which each isolation portion is connected, the adjoining region adjoining the isolation portion, the another one of the plurality of fiber members extending within the adjoining region in a direction which is non-orthogonal to the first direction.

16. The resin-attached lead frame of claim 15, wherein the plurality of fiber members are impregnated with a resin, and the resin has been cured.

17. The resin-attached lead frame of claim 14, further comprising a plurality of additional fiber members, wherein,
the latticework portion of the resin member includes a plurality of second portions extending along the second direction;

in the resin member, another end of each isolation portion is connected to the second portion; and one of the plurality of additional fiber members is located at least in an adjoining region of the second portion to which each isolation portion is connected, the adjoining region adjoining the isolation portion, the one of the plurality of additional fiber members extending within the adjoining region in a direction which is non-orthogonal to the second direction.

18. The resin-attached lead frame of claim 17, wherein the plurality of fiber members are impregnated with a resin, and the resin has been cured.

19. The resin-attached lead frame of claim 14, wherein the plurality of fiber members are impregnated with a resin, and the resin has been cured.

20. The resin-attached lead frame of claim 14, wherein, the plurality of connecting portions of the lead frame include first connecting portions each connecting the first conductive subportion of a conductive portion to the second conductive subportion of an adjacent conductive portion along the first direction, and second connecting portions each connecting the first and second conductive subportions of a conductive portion to the first and second conductive subportions of an adjacent conductive portion along the second direction; each fiber member includes a first fiber portion that is located above the corresponding second connecting portion and a second fiber portion located below the corresponding second connecting portion.

21. The resin-attached lead frame of claim 20, wherein, in the resin member, another end of each isolation portion is connected to another one of the plurality of first portions; and another one of the plurality of fiber members is located at least in an adjoining region of the other first portion to which each isolation portion is connected, the adjoining region adjoining the isolation portion, the another one of the plurality of fiber members extending within the adjoining region in a direction which is non-orthogonal to the first direction.

22. The resin-attached lead frame of claim 21, wherein the plurality of fiber members are impregnated with a resin, and the resin has been cured.

23. The resin-attached lead frame of claim 20, further comprising a plurality of additional fiber members, wherein, the latticework portion of the resin member includes a plurality of second portions extending along the second direction;

in the resin member, another end of each isolation portion is connected to the second portion; and one of the plurality of additional fiber members is located at least in an adjoining region of the second portion to which each isolation portion is connected, the adjoining region adjoining the isolation portion, the one of the plurality of additional fiber members extending within the adjoining region in a direction which is non-orthogonal to the second direction.

24. The resin-attached lead frame of claim 23, wherein the plurality of fiber members are impregnated with a resin, and the resin has been cured.

25. The resin-attached lead frame of claim 20, wherein the plurality of fiber members are impregnated with a resin, and the resin has been cured.

26. The resin-attached lead frame of claim 20, wherein, the latticework portion of the resin member includes a plurality of second portions extending along the second direction; and in between second connecting portions, the first fiber portion and the second fiber portion are adhesively bonded to each other.

27. The resin-attached lead frame of claim 26, wherein the plurality of fiber members are impregnated with a resin, and the resin has been cured.

28. A resin-attached lead frame, comprising:
a lead frame;
a resin member; and
a plurality of fiber members,
wherein the lead frame includes:
a plurality of conductive portions arrayed along a first direction and a second direction which intersects the first direction, each conductive portion having an upper face and a lower face in relation to a third direction which is perpendicular to the first direction and the second direction, and each conductive portion including first and second conductive subportions in a plane containing the first direction and the second direction, the first and second conductive subportions being arranged along the first direction and spaced apart from each other by a gap; and
a plurality of connecting portions connecting between the plurality of conductive portions along the first direction and along the second direction, wherein the resin member includes:
- a plurality of isolation portions each placed in the gap between the first and second conductive subportions; and
- a latticework portion placed between the plurality of conductive portions so as to surround each conductive portion while leaving a part of the upper face and a part of the lower face of the conductive portion exposed, the latticework portion including a plurality of first portions extending along the first direction and a plurality of second portions extending along the second direction, wherein the plurality of fiber members each has a length which is greater than a distance between the first and second conductive subportions, wherein, in the resin member, one end of each isolation portion is connected to a corresponding one of the plurality of first portions, wherein one of the plurality of fiber members is located at least in an adjoining region of the first portion to which each isolation portion is connected, the adjoining region adjoining the isolation portion, the one of the plurality of fiber members extending within the adjoining region in a direction which is non-orthogonal to the first direction, and wherein,
the plurality of connecting portions of the lead frame include
- first connecting portions each connecting the first conductive subportion of a conductive portion to the second conductive subportion of an adjacent conductive portion along the first direction,
- second connecting portions each connecting the first and second conductive subportions of a conductive portion to the first and second conductive subportions of an adjacent conductive portion along the second direction; and
- each fiber member includes a first fiber portion that is located above the corresponding second connecting portion and a second fiber portion located below the corresponding second connecting portion.

29. The resin-attached lead frame of claim 28, wherein,
in the resin member, another end of each isolation portion is connected to another one of the plurality of first portions; and
another one of the plurality of fiber members is located at least in an adjoining region of the other first portion to which each isolation portion is connected, the adjoining region adjoining the isolation portion, the another one of the plurality of fiber members extending within the adjoining region in a direction which is non-orthogonal to the first direction.

30. The resin-attached lead frame of claim 28, further comprising a plurality of additional fiber members,
wherein, the latticework portion of the resin member includes a plurality of second portions extending along the second direction;
in the resin member, another end of each isolation portion is connected to the second portion; and
one of the plurality of additional fiber members is located at least in an adjoining region of the second portion to which each isolation portion is connected, the adjoining region adjoining the isolation portion, the one of the plurality of additional fiber members extending within the adjoining region in a direction which is non-orthogonal to the second direction.

31. The resin-attached lead frame of claim 28, wherein, the latticework portion of the resin member includes a plurality of second portions extending along the second direction;
in between second connecting portions, the first fiber portion and the second fiber portion are adhesively bonded to each other; and
each of the plurality of second portions of the latticework portion has the first fiber portion and the second fiber portion located therein, such that the first fiber portion and the second fiber portion are placed between a plurality of cut lines extending along the second direction but do not intersect the cut lines.

32. The resin-attached lead frame of claim 28, wherein the plurality of fiber members are impregnated with a resin, and the resin has been cured.

33. The resin-attached lead frame of claim 29, wherein the plurality of fiber members are impregnated with a resin, and the resin has been cured.

34. The resin-attached lead frame of claim 30, wherein the plurality of fiber members are impregnated with a resin, and the resin has been cured.

35. The resin-attached lead frame of claim 31, wherein the plurality of fiber members are impregnated with a resin, and the resin has been cured.

36. A resin-attached lead frame, comprising:
a lead frame;
a resin member; and
a plurality of fiber members,
wherein the lead frame includes:
- a plurality of conductive portions arrayed along a first direction and a second and direction which intersects the first direction, each conductive portion having an upper face and a lower face in relation to a third direction which is perpendicular to the first direction and the second direction, and each conductive portion including first and second conductive subportions in a plane containing the first direction and the second direction, the first and second conductive subportions being arranged along the first direction and spaced apart from each other by a gap; and
- a plurality of connecting portions connecting between the plurality of conductive portions along the first direction and along the second direction, wherein the resin member includes:
- a plurality of isolation portions each placed in the gap between the first and second conductive subportions; and
- a latticework portion placed between the plurality of conductive portions so as to surround each conductive portion while leaving a part of the upper face and a part of the lower face of the conductive portion exposed, the latticework portion including a plurality of first portions extending along the first direction and a plurality of second portions extending along the second direction, wherein the plurality of fiber members each has a length which is greater than a distance between the first and second conductive subportions, wherein, in the resin member, one end of each isolation portion is connected to a corresponding one of the plurality of first portions, wherein one of the plurality of fiber members is located at least in an adjoining region of the first portion to which each isolation portion is connected, the adjoining region adjoining the isolation portion, the one of the plurality of fiber members extending within the adjoining region in a direction which is non-orthogonal to the first direction, and
wherein the one fiber member is located downward of at least one of the plurality of connecting portions.

* * * * *